(12) United States Patent
Lee et al.

(10) Patent No.: US 11,756,594 B2
(45) Date of Patent: Sep. 12, 2023

(54) MEMORY DEVICES FOR MULTIPLE READ OPERATIONS

(71) Applicant: MICRON TECHNOLOGY, INC., Boise, ID (US)

(72) Inventors: Eric N. Lee, San Jose, CA (US); Kishore Kumar Muchherla, Fremont, CA (US); Jeffrey S. McNeil, Nampa, ID (US); Jung-Sheng Hoei, Newark, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 17/463,789

(22) Filed: Sep. 1, 2021

(65) Prior Publication Data
US 2022/0189517 A1    Jun. 16, 2022

Related U.S. Application Data

(60) Provisional application No. 63/126,001, filed on Dec. 16, 2020.

(51) Int. Cl.
| | |
|---|---|
| *G11C 7/00* | (2006.01) |
| *G11C 7/10* | (2006.01) |
| *G11C 7/22* | (2006.01) |
| *G11C 7/14* | (2006.01) |

(52) U.S. Cl.
CPC ............ *G11C 7/106* (2013.01); *G11C 7/1057* (2013.01); *G11C 7/1084* (2013.01); *G11C 7/1087* (2013.01); *G11C 7/14* (2013.01); *G11C 7/222* (2013.01)

(58) Field of Classification Search
CPC ...................................................... G11C 7/106
USPC ........................................ 365/189.05, 185.21
See application file for complete search history.

(56) References Cited

U.S. PATENT DOCUMENTS

| | | | |
|---|---|---|---|
| 2014/0269086 A1* | 9/2014 | Lasser .................... | G11C 16/26 365/185.18 |
| 2020/0050393 A1 | 2/2020 | Patel et al. | |
| 2021/0133025 A1* | 5/2021 | Aklik ................... | G06F 11/1048 |
| 2022/0157387 A1* | 5/2022 | Hara ....................... | G11C 16/08 |

* cited by examiner

*Primary Examiner* — Hoai V Ho
(74) *Attorney, Agent, or Firm* — Dicke, Billig & Czaja, PLLC

(57) ABSTRACT

Memory devices might include an array of memory cells, a plurality of access lines, and control logic. The array of memory cells includes a plurality of strings of series-connected memory cells. Each access line of the plurality of access lines is connected to a control gate of a respective memory cell of each string of series-connected memory cells of the plurality of strings of series-connected memory cells. The control logic is configured to: open the array of memory cells for multiple read operations; read first page data from respective memory cells coupled to a selected access line of the plurality of access lines; read second page data from the respective memory cells coupled to the selected access line; and close the array of memory cells subsequent to reading the first page data and the second page data.

16 Claims, 15 Drawing Sheets

MEMORY DEVICES FOR MULTIPLE READ OPERATIONS

RELATED APPLICATION

This application claims the benefit of U.S. Provisional Application No. 63/126,001, filed on Dec. 16, 2020, hereby incorporated herein in its entirety by reference.

TECHNICAL FIELD

The present disclosure relates generally to memory and, in particular, in one or more embodiments, the present disclosure relates to multiple read operations in memory devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

In programming memory, memory cells may generally be programmed as what are often termed single-level cells (SLC) or multiple-level cells (MLC). SLC may use a single memory cell to represent one digit (e.g., bit) of data. For example, in SLC, a Vt of 2.5V might indicate a programmed memory cell (e.g., representing a logical 0) while a Vt of −0.5V might indicate an erased cell (e.g., representing a logical 1). As an example, the erased state in SLC might be represented by any threshold voltage less than or equal to 0V, while the programmed data state might be represented by any threshold voltage greater than 0V.

MLC uses more than two Vt ranges, where each Vt range indicates a different data state. As is generally known, a margin (e.g., a certain number of volts), such as a dead space, may separate adjacent Vt ranges, e.g., to facilitate differentiating between data states. Multiple-level cells can take advantage of the analog nature of traditional non-volatile memory cells by assigning a bit pattern to a specific Vt range. While MLC typically uses a memory cell to represent one data state of a binary number of data states (e.g., 4, 8, 16, . . . ), a memory cell operated as MLC may be used to represent a non-binary number of data states. For example, where the MLC uses three Vt ranges, two memory cells might be used to collectively represent one of eight data states.

In programming MLC memory, data values are often programmed using more than one pass, e.g., programming one or more digits in each pass. For example, in four-level MLC (typically referred to simply as MLC), a first digit, e.g., a least significant bit (LSB), often referred to as lower page (LP) data, may be programmed to the memory cells in a first pass, thus resulting in two (e.g., first and second) threshold voltage ranges. Subsequently, a second digit, e.g., a most significant bit (MSB), often referred to as upper page (UP) data may be programmed to the memory cells in a second pass, typically moving some portion of those memory cells in the first threshold voltage range into a third threshold voltage range, and moving some portion of those memory cells in the second threshold voltage range into a fourth threshold voltage range. Similarly, eight-level MLC (typically referred to as TLC) may represent a bit pattern of three bits, including a first digit, e.g., a least significant bit (LSB) or lower page (LP) data; a second digit, e.g., upper page (UP) data; and a third digit, e.g., a most significant bit (MSB) or extra page (XP) data. In operating TLC, the LP data may be programmed to the memory cells in a first pass, resulting in two threshold voltage ranges, followed by the UP data and the XP data in a second pass, resulting in eight threshold voltage ranges. Similarly, sixteen-level MLC (typically referred to as QLC) may represent a bit pattern of four bits, and 32-level MLC (typically referred to as PLC) may represent a bit pattern of five bits.

When data is read from a memory device, there are read overheads (e.g., prologue, read initialization, read recovery) that add to the total read time. These read overheads might be repeated each time the memory device is accessed to read a single page of data.

DETAILED DESCRIPTION

Figure 1:
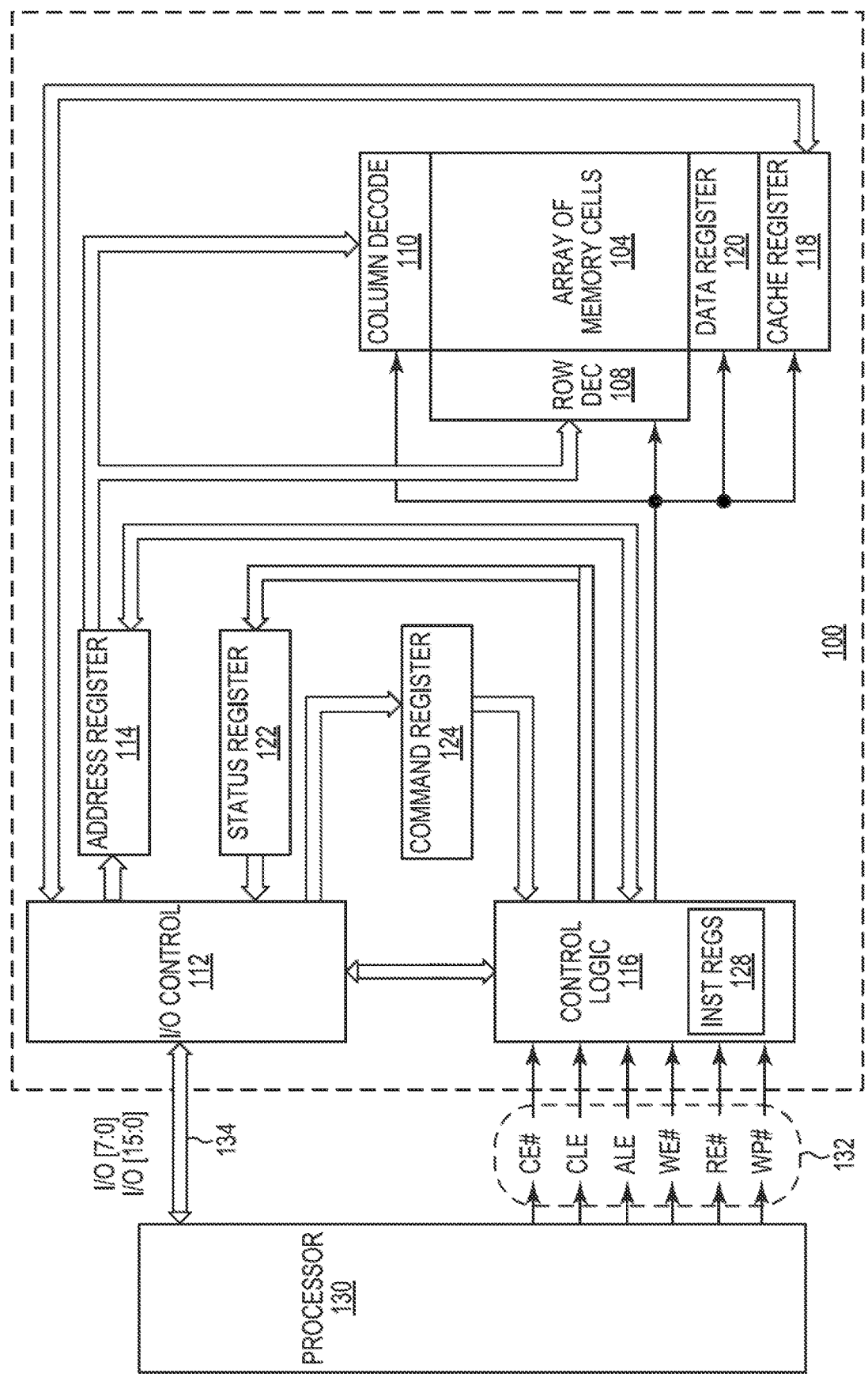
FIG. 1 is a simplified block diagram of a memory in communication with a processor as part of an electronic system, according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

The term "semiconductor" used herein can refer to, for example, a layer of material, a wafer, or a substrate, and includes any base semiconductor structure. "Semiconductor" is to be understood as including silicon-on-sapphire (SOS) technology, silicon-on-insulator (SOI) technology, thin film transistor (TFT) technology, doped and undoped semiconductors, epitaxial layers of a silicon supported by a base semiconductor structure, as well as other semiconductor structures well known to one skilled in the art. Furthermore, when reference is made to a semiconductor in the following description, previous process steps might have been utilized to form regions/junctions in the base semiconductor structure, and the term semiconductor can include the underlying layers containing such regions/junctions.

The term "conductive" as used herein, as well as its various related forms, e.g., conduct, conductively, conducting, conduction, conductivity, etc., refers to electrically conductive unless otherwise apparent from the context. Similarly, the term "connecting" as used herein, as well as its various related forms, e.g., connect, connected, connection, etc., refers to electrically connecting unless otherwise apparent from the context.

It is recognized herein that even where values might be intended to be equal, variabilities and accuracies of industrial processing and operation might lead to differences from their intended values. These variabilities and accuracies will generally be dependent upon the technology utilized in fabrication and operation of the integrated circuit device. As such, if values are intended to be equal, those values are deemed to be equal regardless of their resulting values.

FIG. 1 is a simplified block diagram of a first apparatus, in the form of a memory (e.g., memory device) 100, in communication with a second apparatus, in the form of a processor 130, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 130, e.g., a controller external to the memory device 100, might be a memory controller or other external host device.

Memory device 100 includes an array of memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of array of memory cells 104 are capable of being programmed to one of at least two target data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and may generate status information for the external processor 130, i.e., control logic 116 is configured to perform access operations (e.g., sensing operations [which might include read operations and verify operations], programming operations and/or erase operations) on the array of memory cells 104. The control logic 116 is in communication with row decode circuitry 108 and column decode circuitry 110 to control the row decode circuitry 108 and column decode circuitry 110 in response to the addresses. The control logic 116 might include instruction registers 128 which might represent computer-usable memory for storing computer-readable instructions. For some embodiments, the instruction registers 128 might represent firmware. Alternatively, the instruction registers 128 might represent a grouping of memory cells, e.g., reserved block(s) of memory cells, of the array of memory cells 104.

Control logic 116 might also be in communication with a cache register 118. Cache register 118 latches data, either incoming or outgoing, as directed by control logic 116 to temporarily store data while the array of memory cells 104 is busy writing or reading, respectively, other data. During a programming operation (e.g., write operation), data might be passed from the cache register 118 to the data register 120 for transfer to the array of memory cells 104; then new data might be latched in the cache register 118 from the I/O control circuitry 112. During a read operation, data might be passed from the cache register 118 to the I/O control circuitry 112 for output to the external processor 130; then new data might be passed from the data register 120 to the cache register 118. The cache register 118 and/or the data register 120 might form (e.g., might form a portion of) a page buffer of the memory device 100. A page buffer might further include sensing devices (not shown in FIG. 1) to sense a data state of a memory cell of the array of memory cells 104, e.g., by sensing a state of a data line connected to that memory cell. A status register 122 might be in communication with I/O control circuitry 112 and control logic 116 to latch the status information for output to the processor 130.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) might be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands might be received over input/output (I/O) pins [7:0] of I/O bus 134 at I/O control circuitry 112 and might then be written into command register 124. The addresses might be received over input/output (I/O) pins [7:0] of I/O bus 134 at I/O control circuitry 112 and might then be written into address register 114. The data might be received over input/output (I/O) pins [7:0] for an 8-bit device or input/output (I/O) pins [15:0] for a 16-bit device at I/O control circuitry 112 and then might be written into cache register 118. The data might be subsequently written into data register 120 for programming the array of memory cells 104. For another embodiment, cache register 118 might be omitted, and the data might be written directly into data register 120. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100 by an external device (e.g., processor 130), such as conductive pads or conductive bumps as are commonly used.

It will be appreciated by those skilled in the art that additional circuitry and signals can be provided, and that the memory device 100 of FIG. 1 has been simplified. It should be recognized that the functionality of the various block components described with reference to FIG. 1 might not necessarily be segregated to distinct components or component portions of an integrated circuit device. For example, a single component or component portion of an integrated circuit device could be adapted to perform the functionality of more than one block component of FIG. 1. Alternatively, one or more components or component portions of an integrated circuit device could be combined to perform the functionality of a single block component of FIG. 1.

Additionally, while specific I/O pins are described in accordance with popular conventions for receipt and output of the various signals, it is noted that other combinations or numbers of I/O pins (or other I/O node structures) might be used in the various embodiments.

Figure 2A:
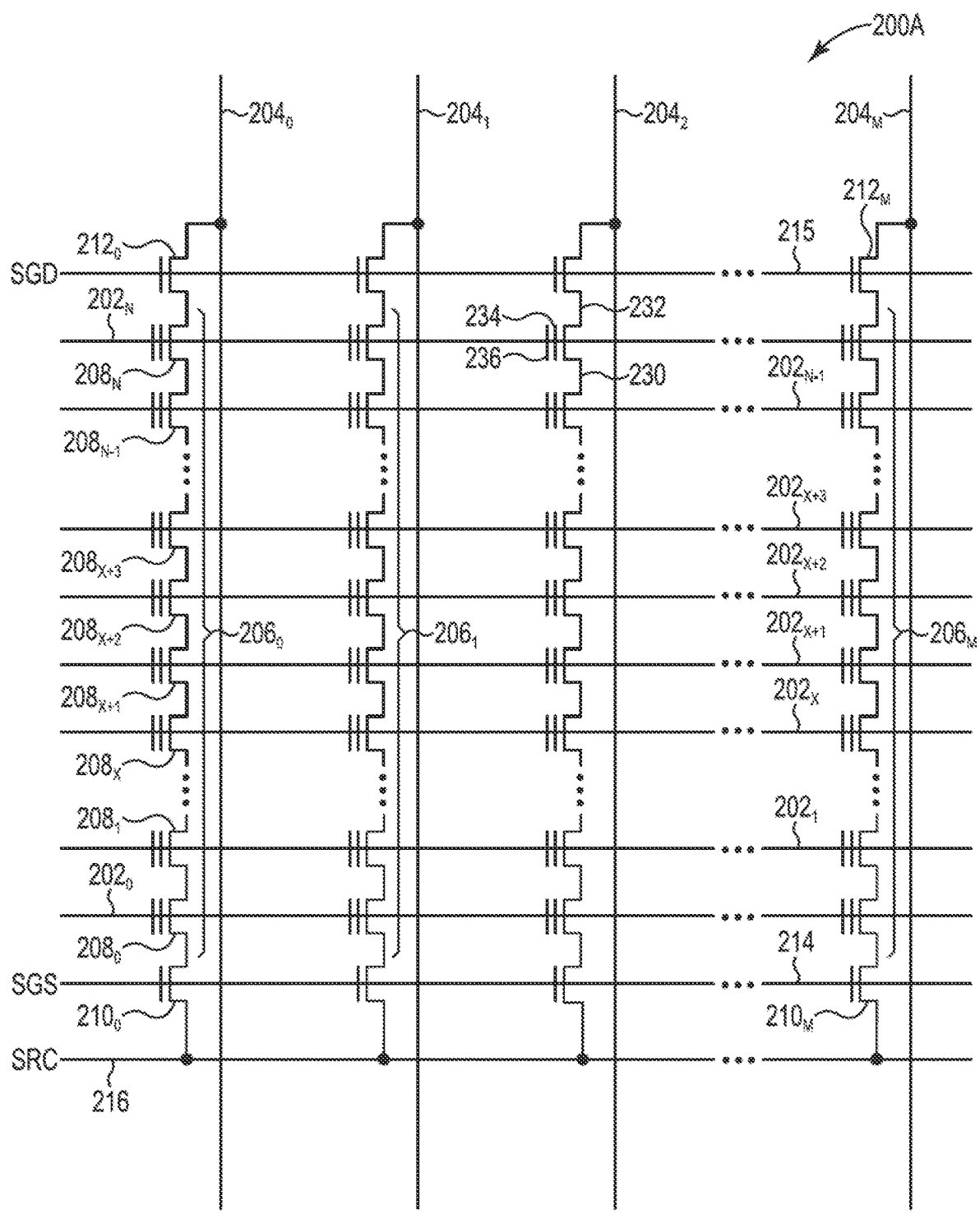
FIGS. 2A-2C are schematics of portions of an array of memory cells as could be used in a memory of the type described with reference to FIG. 1.

FIG. 2A is a schematic of a portion of an array of memory cells 200A, such as a NAND memory array, as could be used in a memory of the type described with reference to FIG. 1, e.g., as a portion of array of memory cells 104. Memory array 200A includes access lines (e.g., word lines) $202_0$ to $202_N$, and data lines (e.g., bit lines) $204_0$ to $204_M$. The access lines 202 might be connected to global access lines (e.g., global word lines), not shown in FIG. 2A, in a many-to-one relationship. For some embodiments, memory array 200A might be formed over a semiconductor that, for example, might be conductively doped to have a conductivity type, such as a p-type conductivity, e.g., to form a p-well, or an n-type conductivity, e.g., to form an n-well.

Memory array 200A might be arranged in rows (each corresponding to an access line 202) and columns (each corresponding to a data line 204). Each column might include a string of series-connected memory cells (e.g., non-volatile memory cells), such as one of NAND strings $206_0$ to $206_M$. Each NAND string 206 might be connected (e.g., selectively connected) to a common source (SRC) 216 and might include memory cells $208_0$ to $208_N$. The memory cells 208 might represent non-volatile memory cells for storage of data. The memory cells $208_0$ to $208_N$ might include memory cells intended for storage of data, and might further include other memory cells not intended for storage of data, e.g., dummy memory cells. Dummy memory cells are typically not accessible to a user of the memory, and are instead typically incorporated into the string of series-connected memory cells for operational advantages that are well understood.

The memory cells 208 of each NAND string 206 might be connected in series between a select gate 210 (e.g., a field-effect transistor), such as one of the select gates $210_0$ to $210_M$ (e.g., that might be source select transistors, commonly referred to as select gate source), and a select gate 212 (e.g., a field-effect transistor), such as one of the select gates $212_0$ to $212_M$ (e.g., that might be drain select transistors, commonly referred to as select gate drain). Select gates $210_0$ to $210_M$ might be commonly connected to a select line 214, such as a source select line (SGS), and select gates $212_0$ to $212_M$ might be commonly connected to a select line 215, such as a drain select line (SGD). Although depicted as traditional field-effect transistors, the select gates 210 and 212 might utilize a structure similar to (e.g., the same as) the memory cells 208. The select gates 210 and 212 might represent a plurality of select gates connected in series, with each select gate in series configured to receive a same or independent control signal.

A source of each select gate 210 might be connected to common source 216. The drain of each select gate 210 might be connected to a memory cell $208_0$ of the corresponding NAND string 206. For example, the drain of select gate $210_0$ might be connected to memory cell $208_0$ of the corresponding NAND string $206_0$. Therefore, each select gate 210 might be configured to selectively connect a corresponding NAND string 206 to common source 216. A control gate of each select gate 210 might be connected to select line 214.

The drain of each select gate 212 might be connected to the data line 204 for the corresponding NAND string 206. For example, the drain of select gate $212_0$ might be connected to the data line $204_0$ for the corresponding NAND string $206_0$. The source of each select gate 212 might be connected to a memory cell $208_N$ of the corresponding NAND string 206. For example, the source of select gate $212_0$ might be connected to memory cell $208_N$ of the corresponding NAND string $206_0$. Therefore, each select gate 212 might be configured to selectively connect a corresponding NAND string 206 to the corresponding data line 204. A control gate of each select gate 212 might be connected to select line 215.

The memory array in FIG. 2A might be a quasi-two-dimensional memory array and might have a generally planar structure, e.g., where the common source 216, NAND strings 206 and data lines 204 extend in substantially parallel planes. Alternatively, the memory array in FIG. 2A might be a three-dimensional memory array, e.g., where NAND strings 206 might extend substantially perpendicular to a plane containing the common source 216 and to a plane containing the data lines 204 that might be substantially parallel to the plane containing the common source 216.

Typical construction of memory cells 208 includes a data-storage structure 234 (e.g., a floating gate, charge trap, or other structure configured to store charge) that can determine a data state of the memory cell (e.g., through changes in threshold voltage), and a control gate 236, as shown in FIG. 2A. The data-storage structure 234 might include both conductive and dielectric structures while the control gate 236 is generally formed of one or more conductive materials. In some cases, memory cells 208 might further have a defined source/drain (e.g., source) 230 and a defined source/drain (e.g., drain) 232. Memory cells 208 have their control gates 236 connected to (and in some cases form) an access line 202.

A column of the memory cells 208 might be a NAND string 206 or a plurality of NAND strings 206 selectively connected to a given data line 204. A row of the memory cells 208 might be memory cells 208 commonly connected to a given access line 202. A row of memory cells 208 can, but need not, include all memory cells 208 commonly connected to a given access line 202. Rows of memory cells 208 might often be divided into one or more groups of physical pages of memory cells 208, and physical pages of memory cells 208 often include every other memory cell 208 commonly connected to a given access line 202. For example, memory cells 208 commonly connected to access line $202_N$ and selectively connected to even data lines 204 (e.g., data lines $204_0$, $204_2$, $204_4$, etc.) might be one physical page of memory cells 208 (e.g., even memory cells) while memory cells 208 commonly connected to access line $202_N$ and selectively connected to odd data lines 204 (e.g., data lines $204_1$, $204_3$, $204_5$, etc.) might be another physical page of memory cells 208 (e.g., odd memory cells). Although data lines $204_3$-$204_5$ are not explicitly depicted in FIG. 2A, it is apparent from the figure that the data lines 204 of the array of memory cells 200A might be numbered consecutively from data line $204_0$ to data line $204_M$. Other groupings of memory cells 208 commonly connected to a given access line 202 might also define a physical page of memory cells 208. For certain memory devices, all memory cells commonly connected to a given access line might be deemed a physical page of memory cells. The portion of a physical page of memory cells (which, in some embodiments, could still be the entire row) that is read during a single read operation or programmed during a single programming operation (e.g., an upper or lower page of memory cells) might be deemed a logical page of memory cells. A block of memory cells might include those memory cells that are configured to be erased together, such as all memory cells connected to access lines $202_0$-$202_N$ (e.g., all NAND strings 206 sharing common access lines 202). Unless expressly distinguished, a reference to a page of memory cells herein refers to the memory cells of a logical page of memory cells.

Although the example of FIG. 2A is discussed in conjunction with NAND flash, the embodiments and concepts described herein are not limited to a particular array architecture or structure, and can include other structures (e.g., SONOS or other data storage structure configured to store charge) and other architectures (e.g., AND arrays, NOR arrays, etc.).

Figure 2B:
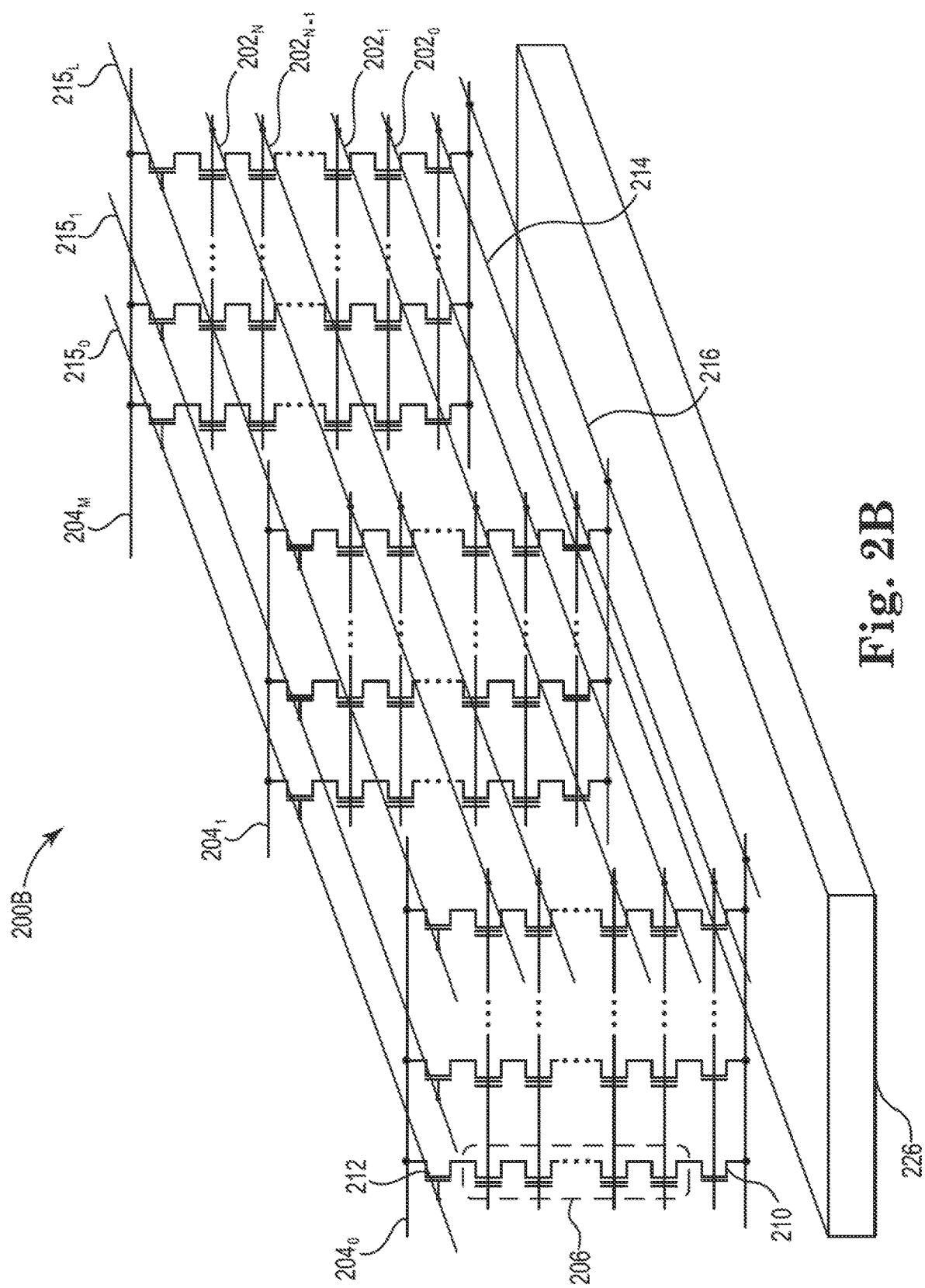

FIG. 2B is another schematic of a portion of an array of memory cells 200B as could be used in a memory of the type described with reference to FIG. 1, e.g., as a portion of array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B might incorporate vertical structures which might include semiconductor pillars where a portion of a pillar might act as a channel region of the memory cells of NAND strings 206. The NAND strings 206 might be each selectively connected to a data line $204_0$ to $204_M$ by a select transistor 212 (e.g., that might be drain select transistors, commonly referred to as select gate drain) and to a common source 216 by a select transistor 210 (e.g., that might be source select transistors, commonly referred to as select gate source). Multiple NAND strings 206 might be selectively connected to the same data line 204. Subsets of NAND strings 206 can be connected to their respective data lines 204 by biasing the select lines $215_0$ to $215_K$ to selectively activate particular select transistors 212 each between a NAND string 206 and a data line 204. The select transistors 210 can be activated by biasing the select line 214. Each access line 202 might be connected to multiple rows of memory cells of the memory array 200B. Rows of memory cells that are commonly connected to each other by a particular access line 202 might collectively be referred to as tiers.

The three-dimensional NAND memory array 200B might be formed over peripheral circuitry 226. The peripheral circuitry 226 might represent a variety of circuitry for accessing the memory array 200B. The peripheral circuitry 226 might include complementary circuit elements. For example, the peripheral circuitry 226 might include both n-channel and p-channel transistors formed on a same semiconductor substrate, a process commonly referred to as CMOS, or complementary metal-oxide-semiconductors. Although CMOS often no longer utilizes a strict metal-oxide-semiconductor construction due to advancements in integrated circuit fabrication and design, the CMOS designation remains as a matter of convenience.

Figure 2C:
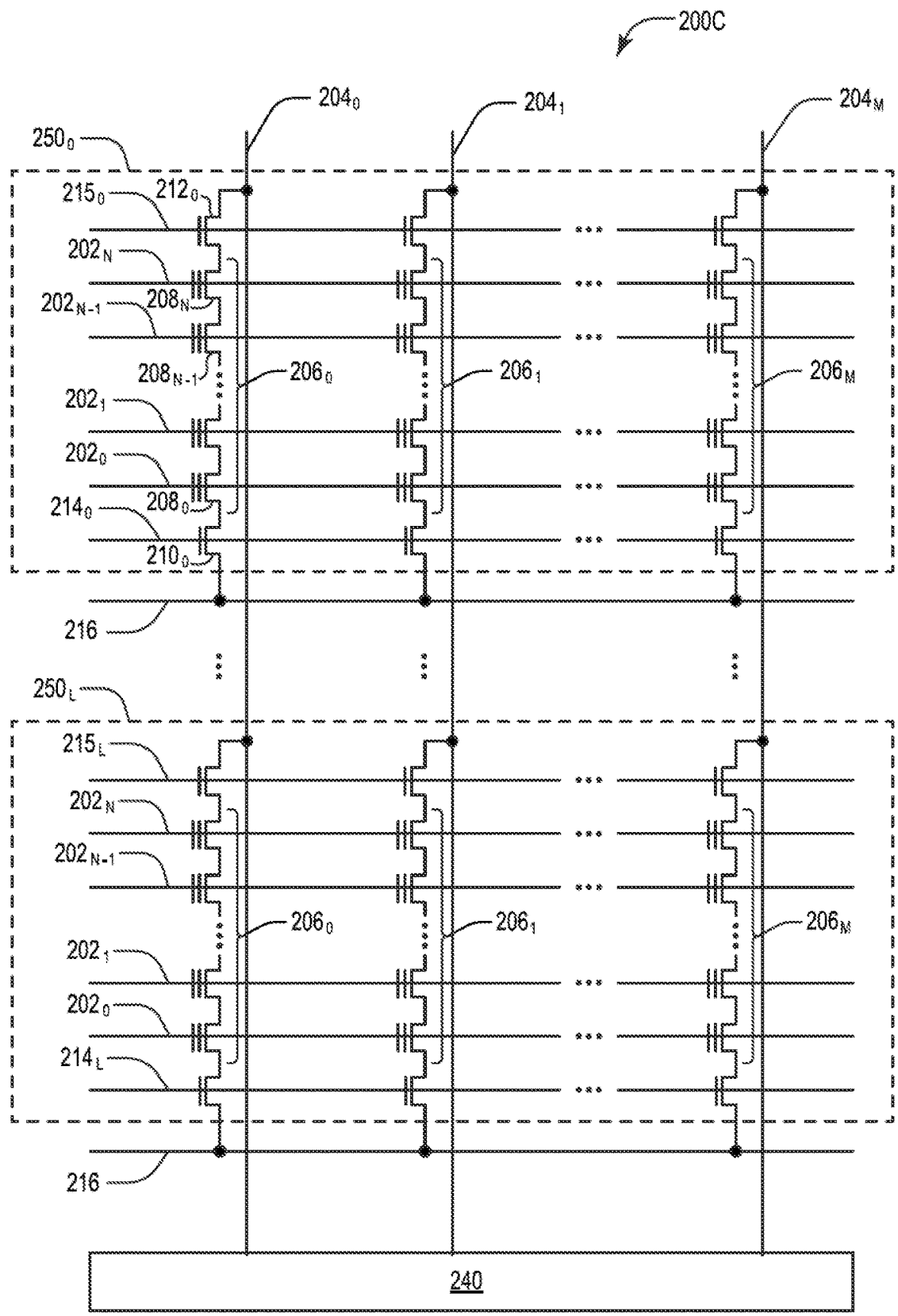

FIG. 2C is a further schematic of a portion of an array of memory cells 200C as could be used in a memory of the type described with reference to FIG. 1, e.g., as a portion of array of memory cells 104. Like numbered elements in FIG. 2C correspond to the description as provided with respect to FIG. 2A. Array of memory cells 200C may include strings of series-connected memory cells (e.g., NAND strings) 206, access (e.g., word) lines 202, data (e.g., bit) lines 204, select lines 214 (e.g., source select lines), select lines 215 (e.g., drain select lines) and source 216 as depicted in FIG. 2A. A portion of the array of memory cells 200A may be a portion of the array of memory cells 200C, for example. FIG. 2C depicts groupings of NAND strings 206 into blocks of memory cells 250, e.g., blocks of memory cells $250_0$ to $250_L$. Blocks of memory cells 250 may be groupings of memory cells 208 that may be erased together in a single erase operation, sometimes referred to as erase blocks. Each block of memory cells 250 might include those NAND strings 206 commonly associated with a single select line 215, e.g., select line $215_0$. The source 216 for the block of memory cells $250_0$ might be a same source as the source 216 for the block of memory cells $250_L$. For example, each block of memory cells $250_0$ to $250_L$ might be commonly selectively connected to the source 216. Access lines 202 and select lines 214 and 215 of one block of memory cells 250 may have no direct connection to access lines 202 and select lines 214 and 215, respectively, of any other block of memory cells of the blocks of memory cells $250_0$ to $250_L$.

The data lines $204_0$ to $204_M$ may be connected (e.g., selectively connected) to a buffer portion 240, which might be a portion of a data buffer of the memory. The buffer portion 240 might correspond to a memory plane (e.g., the set of blocks of memory cells $250_0$ to $250_L$). The buffer portion 240 might include sense circuits (not shown in FIG. 2C) for sensing data values indicated on respective data lines 204.

While the blocks of memory cells 250 of FIG. 2C depict only one select line 215 per block of memory cells 250, the blocks of memory cells 250 might include those NAND strings 206 commonly associated with more than one select line 215. For example, select line $215_0$ of block of memory cells $250_0$ might correspond to the select line $215_0$ of the memory array 200B of FIG. 2B, and the block of memory cells of the memory array 200C of FIG. 2C might further include those NAND strings 206 associated with select lines $215_1$ to $215_K$ of FIG. 2B. In such blocks of memory cells 250 having NAND strings 206 associated with multiple select lines 215, those NAND strings 206 commonly associated with a single select line 215 might be referred to as a sub-block of memory cells. Each such sub-block of memory cells might be selectively connected to the buffer portion 240 responsive to its respective select line 215.

Figure 3A:
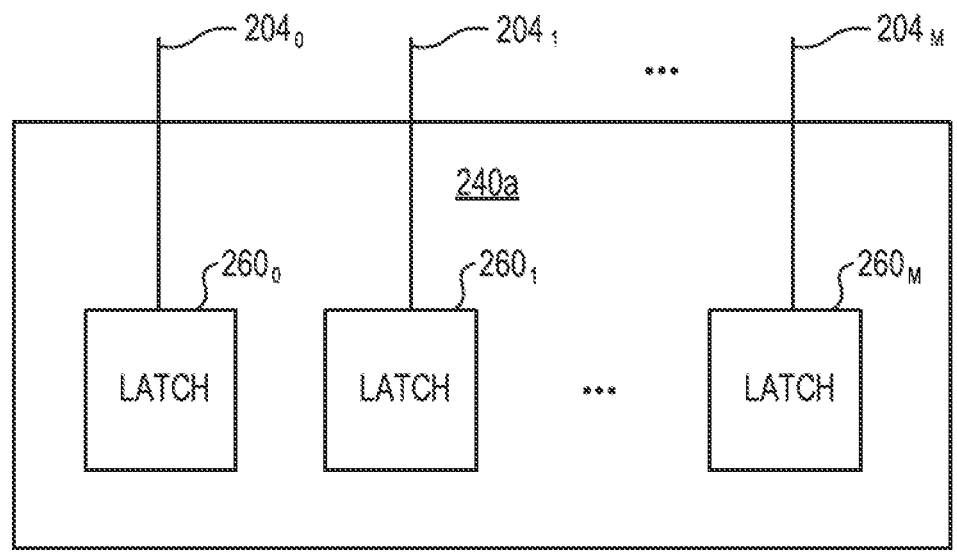
FIGS. 3A and 3B are simplified block diagrams of portions of a page buffer as could be used in the memory of the type described with reference to FIG. 1.

FIG. 3A is a simplified block diagram of portions of a page buffer 240a. In one example, page buffer 240a might be part of buffer portion 240 of FIG. 2C. The data lines $204_0$ to $204_M$ may be connected to the page buffer 240a. The page buffer 240a might include a latch $260_0$ to $260_M$ for each data line $204_0$ to $204_M$, respectively. In one example, each latch $260_0$ to $260_M$ might sequentially store page data (e.g., upper page data, lower page data, extra page data) read from the array of memory cells (e.g., array of memory cells 200C) such that previously read page data (e.g., first page data) is transferred out of the latches $260_0$ to $260_M$ prior to reading additional page data (e.g., second page data). The additional page data is then latched in latches $260_0$ to $260_M$. In another example (commonly referred to as a cache read), each latch $260_0$ to $260_M$ might sequentially store page data read from the array of memory cells such that previously read page data (e.g., first page data) is transferred out of the latches $260_0$ to $260_M$ concurrently with reading additional page data (e.g., second page data). The additional page data is then latched in latches $260_0$ to $260_M$.

Figure 3B:
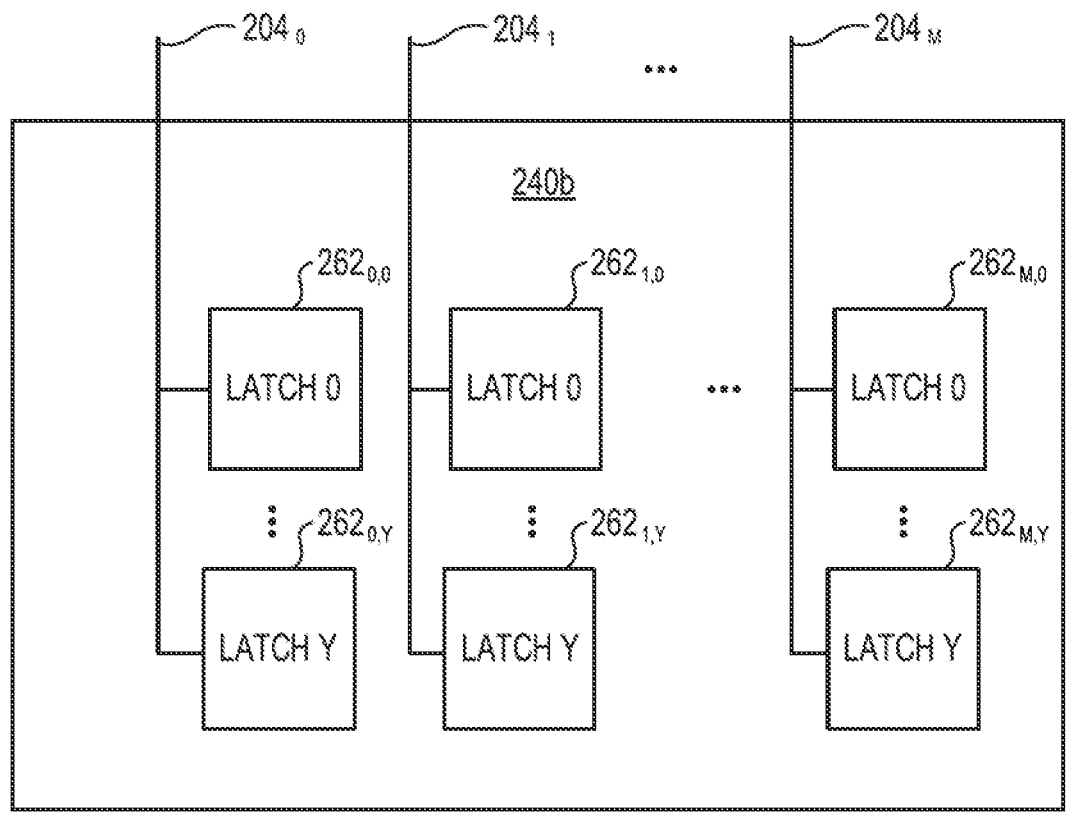

FIG. 3B is a simplified block diagram of portions of another page buffer 240b. In one example, page buffer 240b might be part of buffer portion 240 of FIG. 2C. The data lines $204_0$ to $204_M$ might be connected to the page buffer 240b. The page buffer 240b might include a plurality of latches $262_{0,0}$-$262_{0,Y}$ to $262_{M,0}$-$262_{M,Y}$ for each data line $204_0$ to $204_M$, respectively. Each set of latches $262_{0,0}$-$262_{0,Y}$ to $262_{M,0}$-$262_{M,Y}$ for each data line $204_0$ to $204_M$, respectively, might store multiple pages of data (e.g., lower page data, upper page data, extra page data, etc.) read from the array of memory cells (e.g., array of memory cells 200C) in parallel. For example, latch $262_{0,0}$ may store lower page data, a latch $262_{0,1}$ may store upper page data, and a latch $262_{0,2}$ may store extra page data read from a selected memory cell coupled to the data line $204_0$ in parallel. In one example, the previously read multiple pages of data may be transferred out of the latches $262_{0,0}$-$262_{0,Y}$ to $262_{M,0}$-$262_{M,Y}$ prior to reading additional page data. In another example (commonly referred to as a cache read), the previously read multiple pages of data may be transferred out of the latches $262_{0,0}$-$262_{0,Y}$ to $262_{M,0}$-$262_{M,Y}$ concurrently with reading additional page data.

Figure 4:
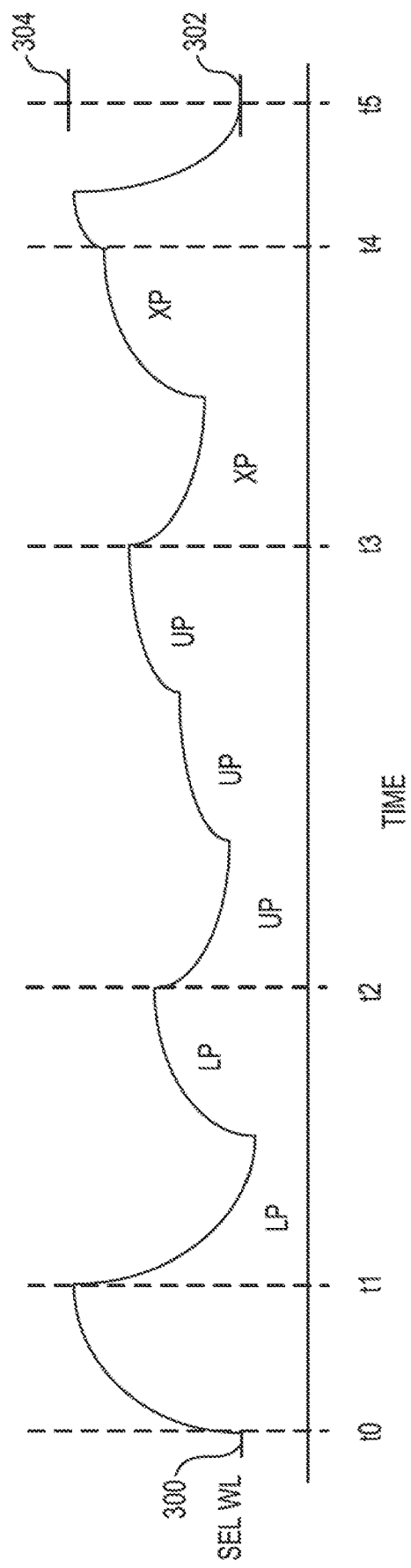
FIG. 4 depicts a timing diagram for a method of operating a memory for use with various embodiments.

FIG. 4 depicts a timing diagram for a method of operating a memory (e.g., memory device 100 of FIG. 1) for use with various embodiments. For simplicity, FIG. 4 and the following FIGS. 5-8 will presume multiple read operations for TLC memory cells, e.g., eight-level memory cells representing data states L0, L1, L2, L3, L4, L5, L6, and L7 using eight threshold voltage ranges, each representing a data state corresponding to a bit pattern of three digits. While discussed in reference to TLC memory cells, multiple read operations performed on lower storage density memory cells, e.g., SLC (two data states) or higher storage density memory cells, e.g., QLC (16 data states) or PLC (32 data states) memory cells, are equally applicable. In this example, multiple pages of data are read from memory cells coupled to a single access line within a single block (or sub-block) of memory cells.

In FIG. 4, trace 300 might represent the voltage level applied to a selected access line (e.g., selected word line) connected to memory cells selected for the multiple read operations, e.g., target memory cells. The following discussion will be made with reference to at least FIG. 2C and will presume that the memory cells selected for the multiple read operations are the memory cells $208_N$ of the NAND strings $206_0$ to $206_M$ of the block of memory cells $250_0$, such that trace 300 might represent the voltage level applied to access line $202_N$. The access line $202_N$ may be referred to as the selected access line as it contains the target memory cells, while remaining access lines 202 may be referred to as unselected access lines.

At time t0, a command is received (e.g., from control logic 116 of FIG. 1) to open the array of memory cells (e.g., array of memory cells 200C) for multiple read operations. In response to the command to open the array of memory cells, a voltage of the selected access line $202_N$ might increase from a reference voltage 302 to a voltage 304 sufficient to activate each respective memory cell $208_N$ coupled to the selected access line $202_N$. While not shown in FIG. 4, in response to the command to open the array of memory cells, the array of memory cells might be opened for multiple read operations between times t0 and t1 by also: increasing the voltage of each unselected access line 202 from the reference voltage 302 to the voltage 304 sufficient to activate each respective memory cell 208 coupled to each unselected access line 202, and biasing the select lines $215_0$ and $214_0$ to activate the respective select gates 212 and 210 to select the respective NAND strings 206 within the block of memory cells $250_0$.

At time t1, the voltage of the selected access line $202_N$ has reached the voltage 304. The period between times t0 and t1 is part of the read overhead since no data is read during this period. At time t1, a command might be received to read first page data (e.g., lower page data) from the respective memory cells $208_N$ coupled to the selected access line $202_N$. Between times t1 and t2, the first page data is read by adjusting the voltage level of the selected access line $202_N$ to sense the lower page data of the respective memory cells $208_N$ (e.g., via sense circuits connected to bit lines $204_0$ to $204_M$). At time t2, a command might be received to read second page data (e.g., upper page data) from the respective memory cells $208_N$ coupled to the selected access line $202_N$. Between times t2 and t3, the second page data is read by adjusting the voltage level of the selected access line $202_N$ to sense the upper page data of the respective memory cells $208_N$. At time t3, a command might be received to read third page data (e.g., extra page data) from the respective memory cells $208_N$ coupled to the selected access line $202_N$. Between times t3 and t4, the third page data is read by adjusting the voltage level of the selected access line $202_N$ to sense the extra page data of the respective memory cells $208_N$.

At time t4, the multiple read operations are complete and a command to close the array of memory cells is received. In response to the command to close the array of memory cells, the voltage of the selected access line $202_N$ is ramped up to the voltage 304 sufficient to activate each respective memory cell $208_N$ coupled to the selected access line $202_N$ followed by ramping down the selected access line $202_N$ to the reference voltage 302. While not shown in FIG. 4, in response to the command to close the array of memory cells, the array of memory cells is closed between times t4 and t5 by also: ramping up the voltage of each unselected access line 202 to the voltage 304 sufficient to activate each respective memory cell 208 coupled to the unselected access lines 202 followed by ramping down the unselected access lines 202 to the reference voltage 302, and biasing the select lines $215_0$ and $214_0$ to deactivate the respective select gates 212 and 210 to deselect the respective NAND strings 206 within the block of memory cells $250_0$.

The period between times t4 and t5 is part of the read overhead since no data is read during this period. By reading multiple pages between times t1 and t4 with a single array opening overhead between times t0 and t1 and a single array closing overhead between times t4 and t5 rather than an array opening overhead and an array closing overhead for each single page read, the overall read time for multiple read operations may be reduced for a selected access line within a single block (or sub-block) of memory cells. In the particular example of FIG. 4, by not closing the array between page reads, the overall read time is reduced by an amount of time equal to two array opening overheads plus two array closing overheads.

It is noted that the array opening overhead and the array closing overhead described herein are distinct from global startup/closing activities performed by a memory device (e.g., 100 of FIG. 1) in response to receiving a read command from a processor (e.g., 130) connected to the memory device. The global startup activities might include certain activities to prepare the memory for a read operation, such as activating voltage generation devices and analog circuitry of an internal controller (e.g., control logic 116 of FIG. 1) and sensing a temperature of the memory to adjust any temperature-dependent variables for the read operation. The global closing activities might include certain activities to return the memory to some initialization state, such as deactivating the voltage generation devices and the analog circuitry of the internal controller. In contrast, the array opening overhead and the array closing overhead described herein are specific to the array of memory cells.

Figure 5:
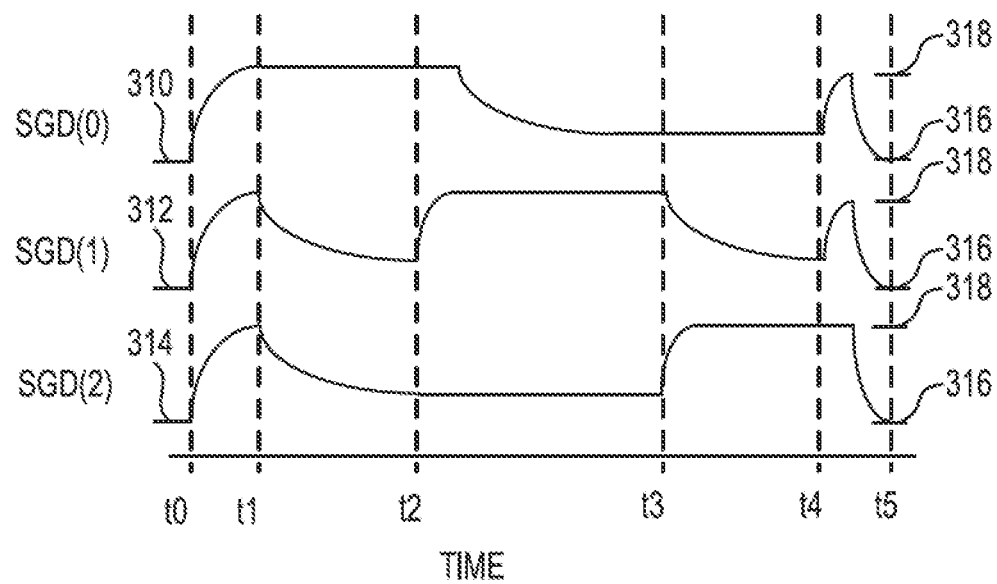
FIG. 5 depicts a timing diagram for another method of operating a memory for use with various embodiments.

FIG. 5 depicts a timing diagram for another method of operating a memory for use with various embodiments. In this example, multiple pages of data are read from memory cells coupled to a single access line (e.g., $202_N$) within multiple blocks (or sub-blocks) of memory cells. In FIG. 5, trace 310 might represent the voltage level applied to a first select line (e.g., select line $215_0$ of block of memory cells $250_0$ in FIG. 2C) connected to respective select gates 212. Trace 312 might represent the voltage level applied to a second select line (e.g., a select line $215_1$ of a block of memory cells $250_1$) connected to respective select gates 212. Trace 312 might represent the voltage level applied to a third select line (e.g., a select line $215_2$ of a block of memory cells $250_2$) connected to respective select gates 212. While FIG. 5 depicts three traces 310, 312, and 314 corresponding to three blocks (or sub-blocks) of memory cells for multiple read operations, in other embodiments the multiple read operations may involve two blocks of memory cells or more than three blocks of memory cells.

At time t0, a command is received (e.g., from control logic 116 of FIG. 1) to open the array of memory cells for multiple read operations. In response to the command to open the array of memory cells, a voltage of each select line $215_0$, $215_1$, $215_2$ might increase from a reference voltage 316 to a voltage 318 sufficient to connect via respective select gates 212 each data line 204 to a respective string of series-connected memory cells 206. While not shown in FIG. 5, in response to the command to open the array of memory cells, the array of memory cells might be opened for multiple read operations between times t0 and t1 by also: increasing the voltage of the selected access line $202_N$ and each unselected access line 202 from a reference voltage to a voltage sufficient to activate each respective memory cell 208 coupled to the selected access line $202_N$ and each unselected access line 202, and biasing the select lines $214_0$, $214_1$, $214_2$ to activate the respective select gates 210 to connect the common source 216 to each respective string of series-connected memory cells 206.

At time t1, the voltage of each select line $215_0$, $215_1$, $215_2$ has reached the voltage 318. The period between times t0 and t1 is part of the read overhead since no data is read during this period. At time t1, a command might be received to read first page data from the respective memory cells $208_N$ coupled to the selected access line $202_N$ for the first block of memory cells $250_0$. Between times t1 and t2, the voltage on select line $215_0$ is maintained to keep the respective select gates 212 active as indicated by trace 310 for the first block of memory cells $250_0$, while the voltage on select lines $215_1$, $215_2$ are reduced to deactivate the respective select gates 212 for the blocks of memory cells $250_1$, $250_2$ as indicated by traces 312, 314. Thus, the respective memory cells coupled to the selected access line $202_N$ within the first block of memory cells $250_0$ are selected. First page data (e.g., lower page data) is then read from the first block of memory cells $250_0$.

At time t2, a command might be received to read second page data from the respective memory cells $208_N$ coupled to the selected access line $202_N$ for the second block of memory cells $250_1$. Between times t2 and t3, the voltage on select line $215_2$ is increased to activate the respective select gates 212 as indicated by trace 312 for the second block of memory cells $250_1$, while the voltage on select lines $215_0$, $215_2$ are reduced (or maintained) to deactivate the respective select gates 212 for the blocks of memory cells $250_0$, $250_2$ as indicated by traces 310, 314. Thus, the respective memory cells coupled to the selected access line $202_N$ within the second block of memory cells $250_1$ are selected. Second page data (e.g., lower page data) is then read from the second block of memory cells $250_1$.

At time t3, a command might be received to read third page data from the respective memory cells $208_N$ coupled to the selected access line $202_N$ for the third block of memory cells $250_2$. Between times t3 and t4, the voltage on select line $215_2$ is increased to activate the respective select gates 212 as indicated by trace 314 for the third block of memory cells $250_2$, while the voltage on select lines $215_1$, $215_2$ are reduced (or maintained) to deactivate the respective select gates 212 for the blocks of memory cells $250_0$, $250_1$ as indicated by traces 310, 312. Thus, the respective memory cells coupled to the selected access line $202_N$ within the third block of memory cells $250_2$ are selected. Third page data (e.g., lower page data) is then read from the third block of memory cells $250_2$.

At time t4, the multiple read operations are complete and a command to close the array of memory cells is received. In response to the command to close the array of memory cells, the voltage of each select line $215_0$, $215_1$, $215_2$ is ramped up to the voltage 318 sufficient to activate the respective select gates 212 coupled to each select line $215_0$, $215_1$, $215_2$ followed by ramping down each select line $215_0$, $215_1$, $215_2$ to the reference voltage 316 as indicated by traces 310, 312, 314. While not shown in FIG. 5, in response to the command to close the array of memory cells, the array of memory cells is closed between times t4 and t5 by also: ramping up the voltage of the selected access line $202_N$ and the unselected access lines 202 to a voltage sufficient to activate each respective memory cell 208 coupled to the selected access line $202_N$ and the unselected access lines 202 followed by ramping down the selected access line $202_N$ and the unselected access lines 202 to a reference voltage, and biasing the select lines $214_0$, $214_1$, $214_2$ to deactivate the respective select gates 210 to disconnect the common source 216 from each respective string of series-connected memory cells 206.

The period between times t4 and t5 is part of the read overhead since no data is read during this period. By reading multiple pages between times t1 and t4 with a single array opening overhead between times t0 and t1 and a single array closing overhead between times t4 and t5 rather than an array opening overhead and an array closing overhead for each single page read, the overall read time for multiple read operations may be reduced for a selected access line for multiple blocks (or sub-blocks) of memory cells. In the particular example of FIG. 5, by not closing the array when switching between blocks of memory cells, the overall read time is reduced by an amount of time equal to two array opening overheads and two array closing overheads.

Figure 6:
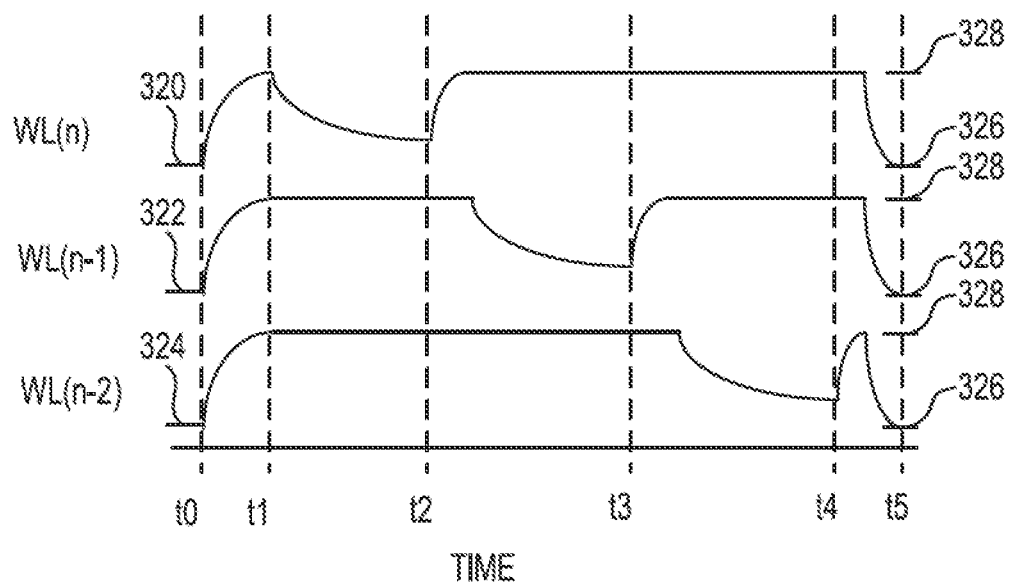
FIG. 6 depicts a timing diagram for another method of operating a memory for use with various embodiments.

FIG. 6 depicts a timing diagram for another method of operating a memory for use with various embodiments. In this example, multiple pages of data are read from memory cells coupled to multiple access lines (e.g., $202_N$, $202_{N-1}$, $202_{N-2}$) within a single block of memory cells (e.g., $250_0$). In FIG. 6, trace 320 might represent the voltage level applied to a first access line $202_N$ connected to respective memory cells $208_N$ within the block of memory cell $250_0$. Trace 322 might represent the voltage level applied to a second access line $202_{N-1}$ connected to respective memory cells $208_{N-1}$ within the block of memory cell $250_0$. Trace 324 might represent the voltage level applied to a third access line $202_{N-2}$ connected to respective memory cells $208_{N-2}$ within the block of memory cell $250_0$. While FIG. 6 depicts three traces 320, 322, and 324 corresponding to three access lines for multiple read operations, in other embodiments the multiple read operations may involve two access lines or more than three access lines.

At time t0, a command is received (e.g., from control logic 116 of FIG. 1) to open the array of memory cells for multiple read operations. In response to the command to open the array of memory cells, a voltage of each access line $202_N$, $202_{N-1}$, $202_{N-2}$ might increase from a reference voltage 326 to a voltage 328 sufficient to activate each respective memory cell 208 coupled to each access line as indicated by traces 320, 322, 324. While not shown in FIG. 6, in response to the command to open the array of memory cells, the array of memory cells might be opened for multiple read operations between times t0 and t1 by also: increasing the voltage of each unselected access line 202 from the reference voltage 326 to the voltage 328 sufficient to activate each respective memory cell 208 coupled to each unselected access line 202, and biasing the select lines $215_0$ and $214_0$ to activate the respective select gates 212 and 210 to select the respective NAND strings 206 within the block of memory cells $250_0$.

At time t1, the voltage of each access line $202_N$, $202_{N-1}$, $202_{N-2}$ has reached the voltage 328. The period between times t0 and t1 is part of the read overhead since no data is read during this period. At time t1, a command might be received to read first page data (e.g., lower page data) from the respective memory cells $208_N$ coupled to the first access line $202_N$. Between times t1 and t2, the voltage of access line $202_N$ is reduced to read the first page data from respective memory cells $208_N$ coupled to the access line $202_N$ as indicated by trace 320, while the voltage of access lines $202_{N-1}$, $202_{N-2}$ is maintained at the voltage 328 sufficient to activate the respective memory cells $208_{N-1}$, $208_{N-2}$ coupled to each access line $202_{N-1}$, $202_{N-2}$ as indicated by traces 322, 324.

At time t2, a command might be received to read second page data from the respective memory cells $208_{N-1}$ coupled to the access line $202_{N-1}$. Between times t2 and t3, the voltage of access line $202_{N-1}$ is reduced to read the second page data (e.g., lower page data) from respective memory cells $208_{N-1}$ coupled to the access line $202_{N-1}$ as indicated by trace 322, while the voltage of access lines $202_N$, $202_{N-2}$ is increased (or maintained) to the voltage 328 sufficient to activate the respective memory cells $208_N$, $208_{N-2}$ coupled to each access line $202_N$, $202_{N-2}$ as indicated by traces 320, 324.

At time t3, a command might be received to read third page data from the respective memory cells $208_{N-2}$ coupled to the selected access line $202_{N-2}$. Between times t3 and t4, the voltage of access line $202_{N-2}$ is reduced to read the third page data (e.g., lower page data) from respective memory cells $208_{N-2}$ coupled to the access line $202_{N-2}$ as indicated by trace 324, while the voltage of access lines $202_N$, $202_{N-1}$ is increased (or maintained) to the voltage 328 sufficient to activate the respective memory cells $208_N$, $208_{N-1}$ coupled to each access line $202_N$, $202_{N-1}$ as indicated by traces 320, 322.

At time t4, the multiple read operations are complete and a command to close the array of memory cells is received. In response to the command to close the array of memory cells, the voltage of each access line $202_N$, $202_{N-1}$, $202_{N-2}$ is ramped up to the voltage 328 sufficient to activate the respective memory cells $208_N$, $208_{N-1}$, $208_{N-2}$ coupled to each access line followed by ramping down each access line $202_N$, $202_{N-1}$, $202_{N-2}$ to the reference voltage 326. While not shown in FIG. 6, in response to the command to close the array of memory cells, the array of memory cells is closed between times t4 and t5 by also: ramping up the voltage of the unselected access lines 202 to the voltage 328 sufficient to activate each respective memory cell 208 coupled to the unselected access lines 202 followed by ramping down the unselected access lines 202 to the reference voltage 326, and biasing the select lines $215_0$ and $214_0$ to deactivate the respective select gates 212 and 210 to deselect the respective NAND strings 206 of the block of memory cells $250_0$.

The period between times t4 and t5 is part of the read overhead since no data is read during this period. By reading multiple pages between times t1 and t4 with a single array opening overhead between times t0 and t1 and a single array closing overhead between times t4 and t5 rather than an array opening overhead and an array closing overhead for each single page read, the overall read time for multiple read operations may be reduced for multiple access lines within a single block (or sub-block) of memory cells. In the particular example of FIG. 6, by not closing the array between page reads, the overall read time is reduced by an amount of time equal to two array opening overheads and two array closing overheads.

Figure 7:
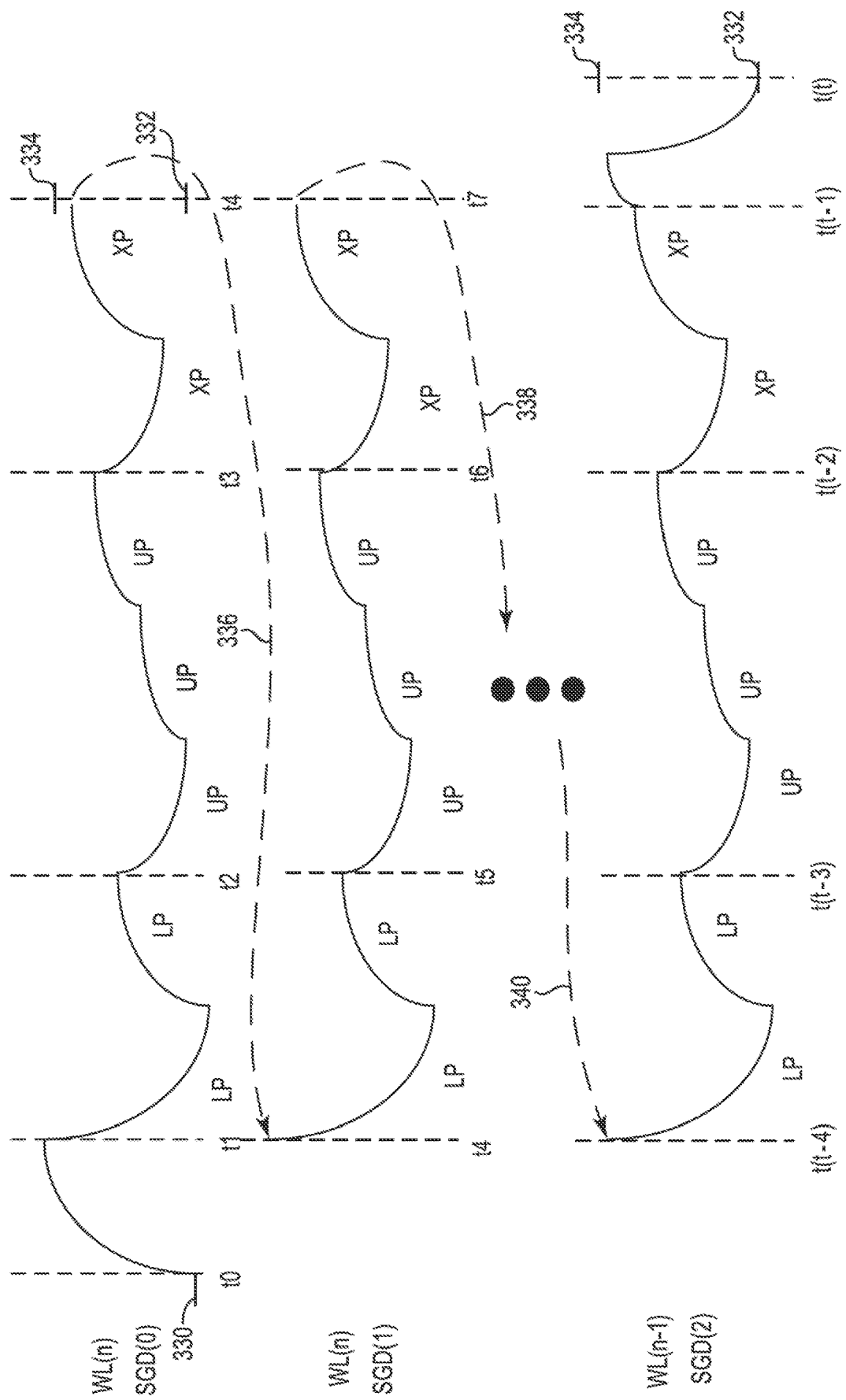
FIG. 7 depicts a timing diagram for another method of operating a memory for use with various embodiments.

FIG. 7 depicts a timing diagram for another method of operating a memory for use with various embodiments. In this example, multiple pages of data are read from memory cells coupled to multiple access lines (e.g., $202_N$ and $202_{N-1}$) within multiple blocks (or sub-blocks) of memory cells (e.g., $250_0$, $250_1$, $250_2$). In FIG. 7, trace 330 might represent the voltage level applied to a currently selected access line 202 (the selected access line changes in FIG. 7) coupled to respective memory cells 208. While FIG. 7 depicts two access lines $202_N$ and $202_{N-1}$ and three blocks of memory cells $250_0$, $250_1$, $250_2$ for multiple read operations, in other embodiments the multiple read operations may involve one access line, more than two access lines, less than three blocks of memory cells, or more than three blocks of memory cells.

At time t0, a command is received (e.g., from control logic 116 of FIG. 1) to open the array of memory cells for multiple read operations. In response to the command to open the array of memory cells, a voltage of the selected access line $202_N$ might increase from a reference voltage 332 to a voltage 334 sufficient to activate each respective memory cell $208_N$ coupled to the selected access line $202_N$. While not shown in FIG. 7, in response to the command to open the array of memory cells, the array of memory cells might be opened for multiple read operations between times t0 and t1 by also: increasing the voltage of the unselected access lines (e.g., $202_{N-1}$ and the other access lines 202) from the reference voltage 332 to the voltage 334 sufficient to activate each respective memory cell 208 coupled to each unselected access line, and biasing the select lines $215_0$, $215_1$, $215_2$ and $214_0$, $214_1$, $214_2$ to activate the respective select gates 212 and 210 to select each respective string of series-connected memory cells 206 within the blocks of memory cells $250_0$, $250_1$, $250_2$.

At time t1, the voltage of the selected access line $202_N$ has reached the voltage 334. The period between times t0 and t1 is part of the read overhead since no data is read during this period. At time t1, a command might be received to read first page data (e.g., lower page data) from the respective memory cells $208_N$ coupled to the selected access line $202_N$ for the first block of memory cells $250_0$. Between times t1 and t2, the first page data is read by adjusting the voltage level of the selected access line $202_N$ to sense the lower page data of the respective memory cells $208_N$ for the first block of memory cells $250_0$. At time t2, a command might be received to read second page data (e.g., upper page data) from the respective memory cells $208_N$ coupled to the selected access line $202_N$ for the first block of memory cells $250_0$. Between times t2 and t3, the second page data is read by adjusting the voltage level of the selected access line $202_N$ to sense the upper page data of the respective memory cells $208_N$ for the first block of memory cells $250_0$. At time t3, a command might be received to read third page data (e.g., extra page data) from the respective memory cells $208_N$ coupled to the selected access line $202_N$ for the first block of memory cells $250_0$. Between times t3 and t4, the third page data is read by adjusting the voltage level of the selected access line $202_N$ to sense the extra page data of the respective memory cells $208_N$ for the first block of memory cells $250_0$.

The multiple read operations continue as indicated by 336 between time t4 of the first row of FIG. 7 and time t4 of the second row of FIG. 7. At time t4, a command might be received to read first page data (e.g., lower page data) from the respective memory cells $208_N$ coupled to the selected access line $202_N$ for a second block of memory cells $250_1$. Between times t4 and t5, the first page data is read by adjusting the voltage level of the selected access line $202_N$ to sense the lower page data of the respective memory cells $208_N$ for the second block of memory cells $250_1$. At time t5, a command might be received to read second page data (e.g., upper page data) from the respective memory cells $208_N$ coupled to the selected access line $202_N$ for the second block of memory cells $250_1$. Between times t5 and t6, the second page data is read by adjusting the voltage level of the selected access line $202_N$ to sense the upper page data of the respective memory cells $208_N$ for the second block of memory cells $250_1$. At time t6, a command might be received to read third page data (e.g., extra page data) from the respective memory cells $208_N$ coupled to the selected access line $202_N$ for the second block of memory cells $250_1$. Between times t6 and t7, the third page data is read by adjusting the voltage level of the selected access line $202_N$ to sense the extra page data of the respective memory cells $208_N$ for the second block of memory cells $250_1$.

After time t7 as indicated by 338, the multiple read operations continue for respective memory cells $208_N$ coupled to the selected access line $202_N$ for a third block of memory cells $250_2$. After reading the data (e.g., lower page data, upper page data, and extra page data) from the respective memory cells coupled to the selected access line $202_N$ for the third block of memory cells $250_2$, as indicated by 340 the multiple read operations continue for respective memory cells $208_{N-1}$ coupled to a selected access line $202_{N-1}$ for the first block of memory cells $250_0$. The multiple read operations then proceed for respective memory cells $208_{N-1}$ coupled to the selected access line $202_{N-1}$ for the second block of memory cells $250_1$.

At time t(−4), a command might be received to read first page data (e.g., lower page data) from the respective memory cells $208_{N-1}$ coupled to the selected access line $202_{N-1}$ for the third block of memory cells $250_2$. Between times t(−4) and t(−3), the first page data is read by adjusting the voltage level of the selected access line $202_{N-1}$ to sense the state of the respective memory cells $208_{N-1}$ for the third block of memory cells $250_2$. At time t(−3), a command might be received to read second page data (e.g., upper page data) from the respective memory cells $208_{N-1}$ coupled to the selected access line $202_{N-1}$ for the third block of memory cells $250_2$. Between times t(−3) and t(−2), the second page data is read by adjusting the voltage level of the selected access line $202_{N-1}$ to sense the upper page data of the respective memory cells $208_{N-1}$ for the third block of memory cells $250_2$. At time t(−2), a command might be received to read third page data (e.g., extra page data) from the respective memory cells $208_{N-1}$ coupled to the selected access line $202_{N-1}$ for the third block of memory cells $250_2$. Between times t(−2) and t(−1), the third page data is read by adjusting the voltage level of the selected access line $202_{N-1}$ to sense the state of the respective memory cells $208_{N-1}$ for the third block of memory cells $250_2$.

At time t(−1), the multiple read operations are complete and a command to close the array of memory cells is received. In response to the command to close the array of memory cells, the voltage of the currently selected access line $202_{N-1}$ is ramped up to the voltage 334 sufficient to activate each respective memory cell $208_{N-1}$ coupled to the currently selected access line $202_{N-1}$ followed by ramping down the currently selected access line $202_{N-1}$ to the reference voltage 332. While not shown in FIG. 7, in response to the command to close the array of memory cells, the array of memory cells is closed between times t(−1) and t(t) by also: ramping up the voltage of the unselected access lines 202 to the voltage 334 sufficient to activate each respective memory cell 208 coupled to the unselected access lines 202 followed by ramping down the unselected access lines 202 to the reference voltage 332, and biasing the select lines $215_0$, $215_1$, $215_2$ and $214_0$, $214_1$, $214_2$ to deactivate the respective select gates 212 and 210 to deselect each respective string of series-connected memory cells 206 within the blocks of memory cells $250_0$, $250_1$, $250_2$.

The period between time t(−1) and t(t) is part of the read overhead since no data is read during this period. By reading multiple pages between times t1 and t(t−1) with a single array opening overhead between times t0 and t1 and a single array closing overhead between times t(t−1) and t(t) rather than an array opening overhead and an array closing overhead for each single page read, the overall read time for multiple read operations may be reduced for a multiple access lines within multiple blocks (or sub-blocks) of memory cells. In the particular example of FIG. 7, by not closing the array between page reads, the overall read time is reduced by an amount of time equal to 12 array opening overheads and 12 array closing overheads.

Figure 8:
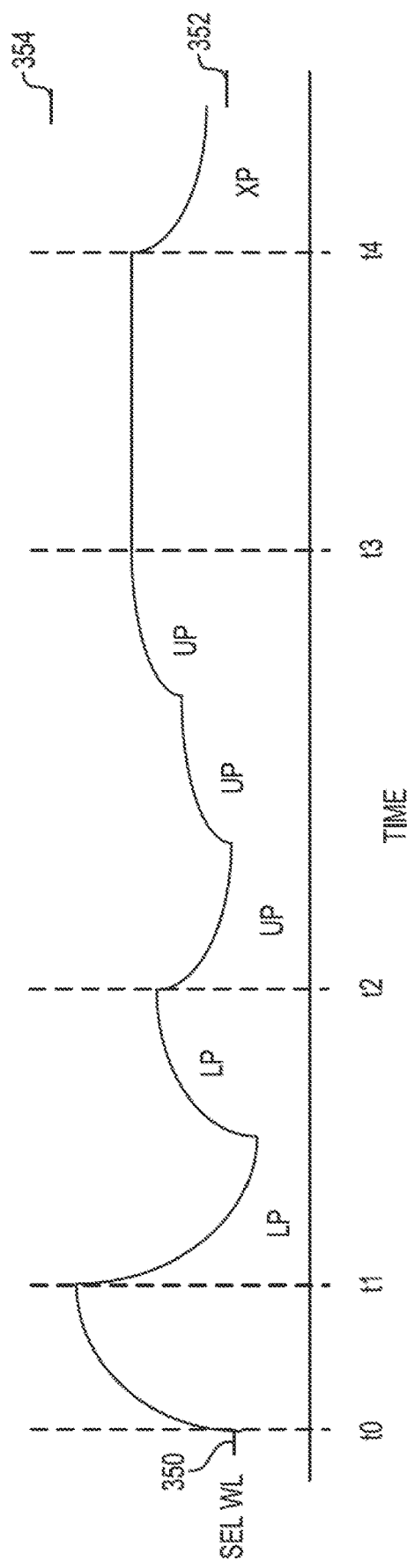
FIG. 8 depicts a timing diagram for another method of operating a memory for use with various embodiments.

FIG. 8 depicts a timing diagram for another method of operating a memory for use with various embodiments. In FIG. 8, trace 350 might represent the voltage level applied to an access line (e.g., selected word line) connected to memory cells selected for the multiple read operations, e.g., target memory cells. The following discussion will be made with reference to at least FIG. 2A and will presume that the memory cells selected for the read operation are the memory cells $208_N$ of the NAND strings $206_0$ to $206_M$ of the block of memory cells $250_0$, such that trace 350 might represent the voltage level applied to access line $202_N$. The access line $202_N$ may be referred to as the selected access line as it contains the target memory cells, while remaining access lines 202 may be referred to as unselected access lines.

At time t0, a command is received (e.g., from control logic 116 of FIG. 1) to open the array of memory cells for multiple read operations. In response to the command to open the array of memory cells, a voltage of the selected access line $202_N$ might increase from a reference voltage 352 to a voltage 354 sufficient to activate each respective memory cell $208_N$ coupled to the selected access line $202_N$. While not shown in FIG. 8, in response to the command to open the array of memory cells, the array of memory cells might be opened for multiple read operations between times t0 and t1 by also: increasing the voltage of each unselected access line 202 from the reference voltage 352 to the voltage 352 sufficient to activate each respective memory cell 208 coupled to each unselected access line 202, and biasing the select lines $215_0$ and $214_0$ to activate the respective select gates 212 and 210 to select the respective NAND strings 206 within the block of memory cells $250_0$.

At time t1, the voltage of the selected access line $202_N$ has reached the voltage 354. The period between times t0 and t1 is part of the read overhead since no data is read during this period. At time t1, a command might be received to read first page data (e.g., lower page data) from the respective memory cells $208_N$ coupled to the selected access line $202_N$. Between times t1 and t2, the first page data is read by adjusting the voltage level of the selected access line $202_N$ to sense the lower page data of the respective memory cells $208_N$. At time t2, a command might be received to read second page data (e.g., upper page data) from the respective memory cells $208_N$ coupled to the selected access line $202_N$. Between times t2 and t3, the second page data is read by adjusting the voltage level of the selected access line $202_N$ to sense the upper page data of the respective memory cells $208_N$. At time t3, no command is received to read third page data (e.g., extra page data) from the respective memory cells $208_N$ coupled to the selected access line $202_N$ thus resulting in a delay between times t3 and t4. The delay might be due to the memory array timing and control logic input based on the read bandwidth of the memory array. After the delay at time t4, a command might be received to read third page data (e.g., extra page data) from the respective memory cells $208_N$ coupled to the selected access line $202_N$ and the multiple read operations continue as previously described.

The bias voltages applied to the selected access line $202_N$ and the unselected access lines 202 (and the select lines 215 and 214) are maintained during the delay between times t3 and t4. In one example, if the delay exceeds a threshold period, the array of memory cells is closed prior to reading the third page data and reopened for multiple read operations prior to reading the third page data in response to closing the array of memory cells. While the delay in FIG. 8 is shown as being between times t3 and t4, in other examples the delay may be at other times. In addition, there may be multiple delays while implementing multiple read operations without closing the array of memory cells.

Figure 9:
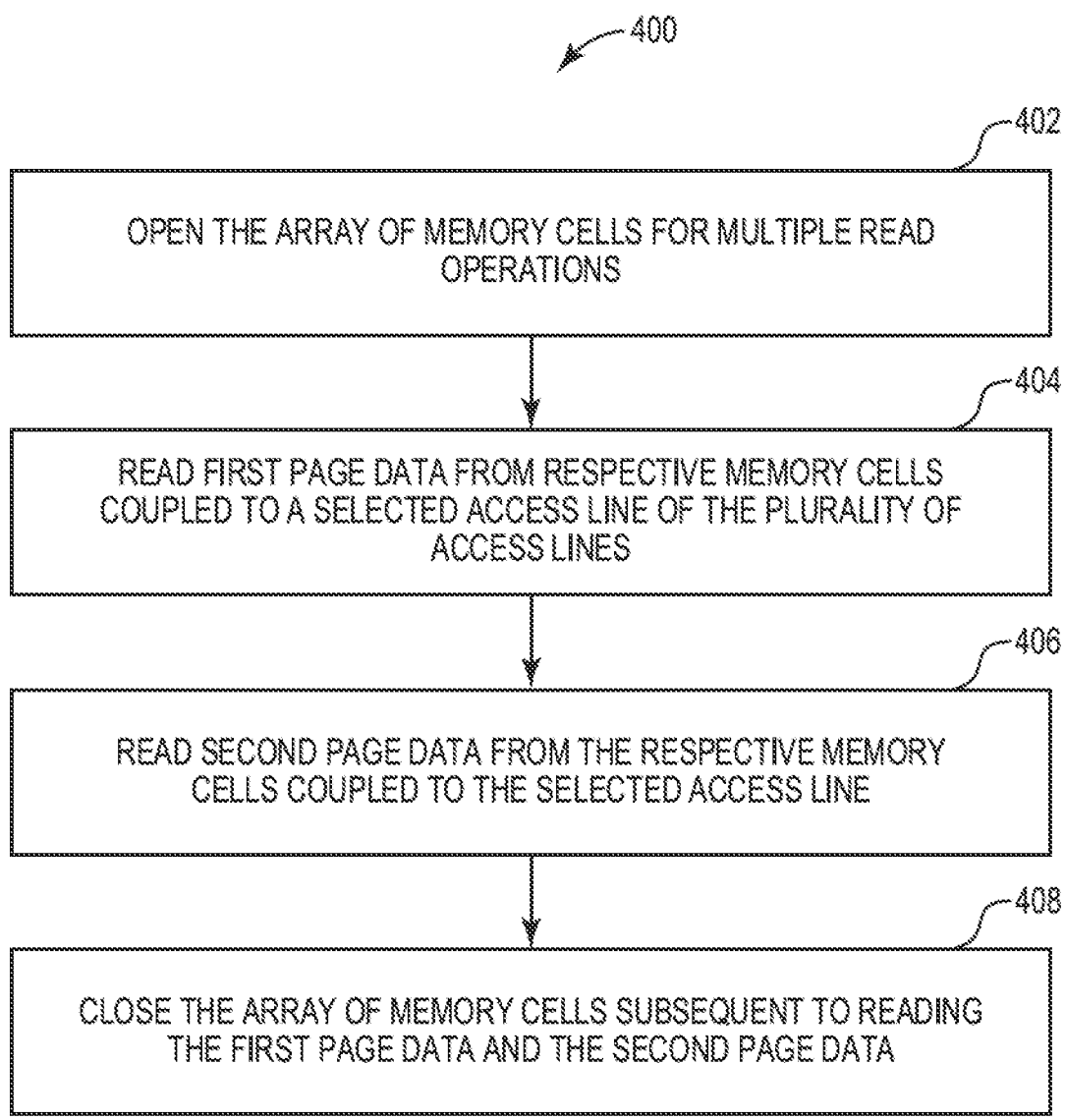
FIG. 9 is a flowchart of a method of operating a memory in accordance with an embodiment.

FIG. 9 is a flowchart of a method 400 of operating a memory in accordance with an embodiment. Method 400 might be implemented by control logic 116 of memory device 100 of FIG. 1 and may correspond at least in part to the timing diagram of FIG. 4. Method 400 might be implemented by a memory device including an array of memory cells comprising a plurality of strings of series-connected memory cells; and a plurality of access lines, where each access line of the plurality of access lines is connected to a control gate of a respective memory cell of each string of series-connected memory cells of the plurality of strings of series-connected memory cells as previously described at least with reference to FIG. 2C.

At 402, the control logic may be configured to open the array of memory cells for multiple read operations. In one example, the control logic may be configured to open the array of memory cells for multiple read operations by ramping up each access line (e.g., 202) of the plurality of access lines from a reference voltage to a voltage sufficient to activate each respective memory cell (e.g., 208) coupled to each access line of the plurality of access lines.

At 404, the control logic may be configured to read first page data (e.g., a first logical page) from respective memory cells coupled to a selected access line of the plurality of access lines. At 406, the control logic may be configured to read second page data (e.g., a second logical page) from the respective memory cells coupled to the selected access line. In one example, the control logic may be configured to read the second page data without ramping down an unselected access line of the plurality of access lines to the reference voltage after reading the first page data. In another example, the control logic may be configured to read the second page data without ramping down any unselected access lines of the plurality of access lines to the reference voltage after reading the first page data.

At 408, the control logic may be configured to close the array of memory cells subsequent to reading the first page data and the second page data. In one example, the control logic may be configured to close the array of memory cells by ramping up each access line of the plurality of access lines to the voltage sufficient to activate each respective memory cell coupled to each access line of the plurality of access lines followed by ramping down each access line of the plurality of access lines to the reference voltage.

The first page data and the second page data may be sequentially stored in respective latches (e.g., $260_0$ to $260_M$) of a page buffer (e.g., 240a of FIG. 3A). In one embodiment, the control logic may be configured to transfer the first page data out of the respective latches prior to reading the second page data. In another embodiment, the control logic may be configured to transfer the first page data out of the respective latches concurrently with reading the second page data. In another embodiment, the first page data and the second page data may be stored in parallel in a respective plurality of latches (e.g., $262_{0,1}$-$262_{0,Y}$ to $262_{M,1}$-$262_{M,Y}$) of a page buffer (e.g., 240*b* of FIG. 3B).

Figure 10:
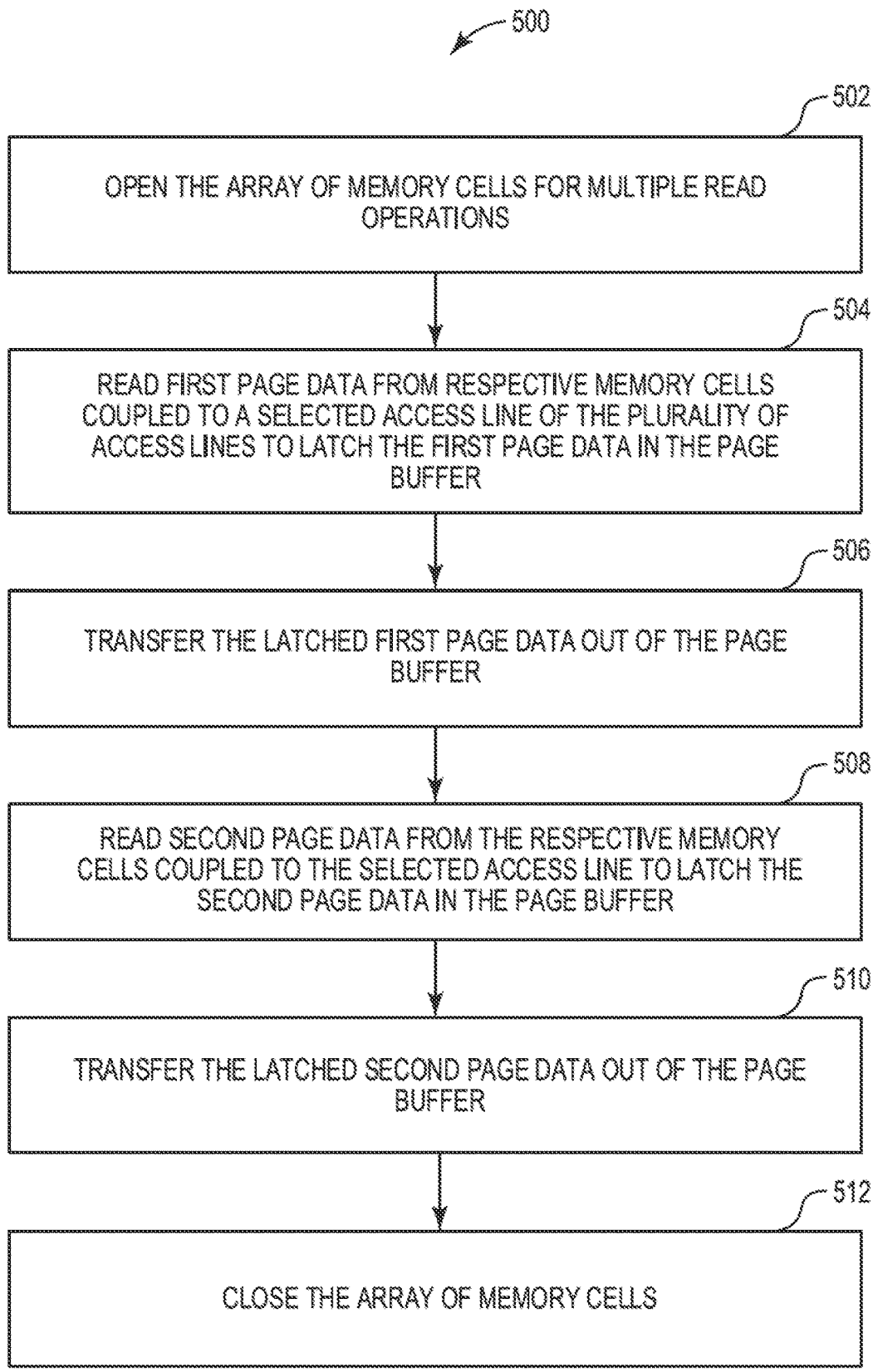
FIG. 10 is a flowchart of a method of operating a memory in accordance with another embodiment.

FIG. 10 is a flowchart of a method 500 of operating a memory in accordance with another embodiment. Method 500 might be implemented by control logic 116 of memory device 100 of FIG. 1 and may correspond at least in part to the timing diagrams of FIGS. 4 and 8. Method 500 might be implemented by a memory device including an array of memory cells comprising a plurality of strings of series-connected memory cells; a plurality of access lines, wherein each access line of the plurality of access lines is connected to a control gate of a respective memory cell of each string of series-connected memory cells of the plurality of strings of series-connected memory cells; and a page buffer connected to the array of memory cells as previously described at least with reference to FIGS. 2C-3B.

At 502, the control logic may be configured to open the array of memory cells for multiple read operations. At 504, the control logic may be configured to read first page data from respective memory cells (e.g., 208) coupled to a selected access line (e.g., 202) of the plurality of access lines to latch the first page data in the page buffer (e.g., in latch $260_0$ to $260_M$ of page buffer 240*a* of FIG. 3A). At 506, the control logic may be configured to transfer the latched first page data out of the page buffer. At 508, the control logic may be configured to read second page data from the respective memory cells coupled to the selected access line to latch the second page data in the page buffer. In one embodiment, the control logic may be configured to transfer the latched first page data out of the page buffer concurrently with reading the second page data. In another embodiment, the control logic may be configured to transfer the latched first page data out of the page buffer prior to reading the second page data. At 510, the control logic may be configured to transfer the latched second page data out of the page buffer. At 512, the control logic may be configured to close the array of memory cells.

In one embodiment, the control logic may be configured to maintain bias voltages applied to the plurality of access lines in response to a delay between latching the first page data in the page buffer and reading the second page data. The control logic may be configured to close the array of memory cells prior to reading the second page data in response to the delay exceeding a threshold period, and reopen the array of memory cells for multiple read operations prior to reading the second page data in response to closing the array of memory cells.

FIGS. 11A-11D are flowcharts of a method 600 of operating a memory in accordance with another embodiment. Method 600 might be implemented by control logic 116 of memory device 100 of FIG. 1 and may correspond at least in part to the timing diagrams of FIGS. 5-7. Method 600 might be implemented within a memory device including an array of memory cells comprising a plurality of strings of series-connected memory cells; a plurality of access lines, wherein each access line of the plurality of access lines is connected to a control gate of a respective memory cell of each string of series-connected memory cells of the plurality of strings of series-connected memory cells; a plurality of data lines, wherein each data line of the plurality of data lines is connected to a respective subset of strings of series-connected memory cells of the plurality of strings of series-connected memory cells via respective select gates of a plurality of select gates; and a plurality of select lines, wherein each select line of the plurality of select lines is connected to a control gate of a respective select gate of the plurality of select gates for a respective subset of the plurality of select gates as previously described at least with reference to FIG. 2C.

Figure 11A:
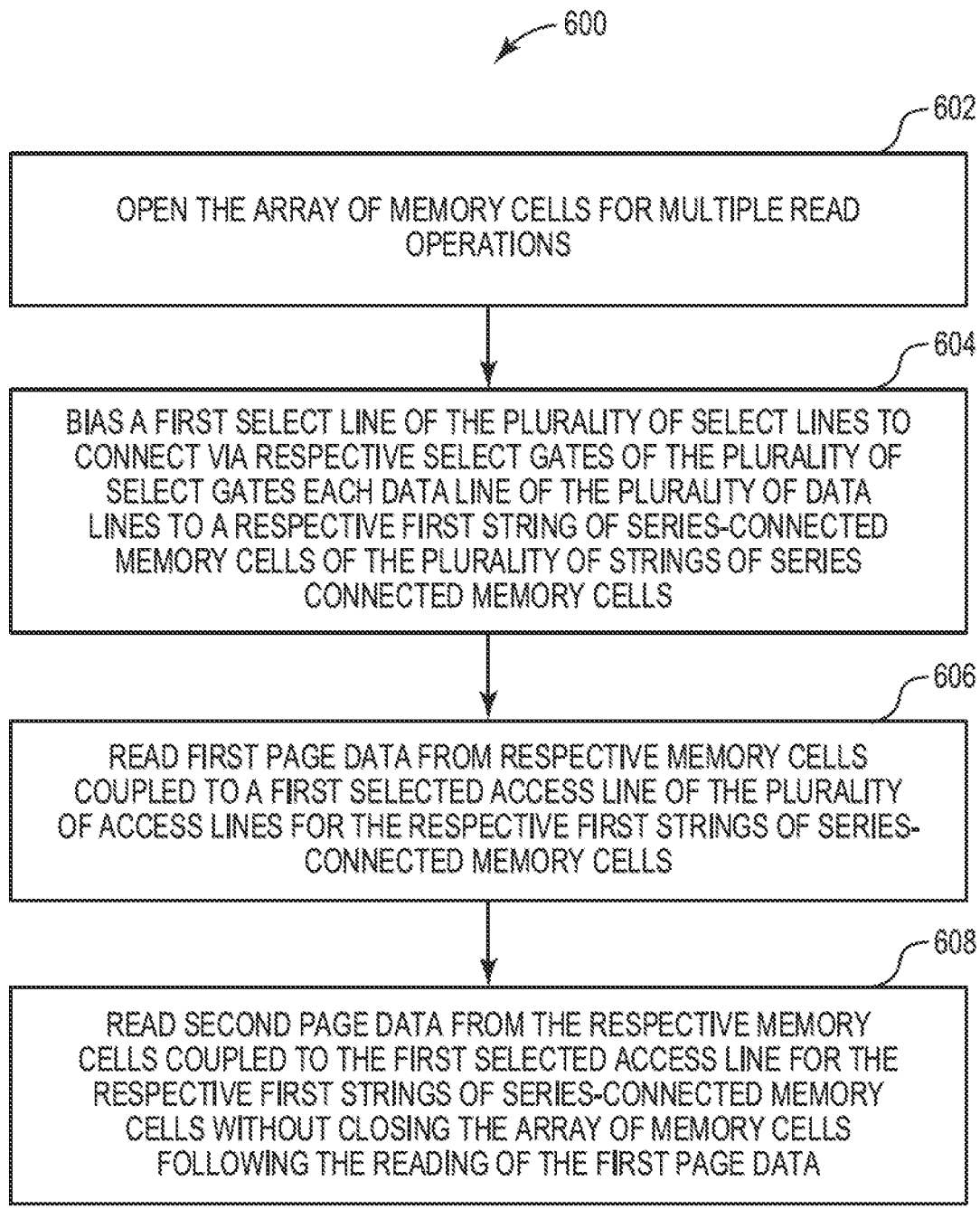
FIGS. 11A-11D are flowcharts of a method of operating a memory in accordance with another embodiment.

As illustrated in FIG. 11A at 602, the control logic may be configured to open the array of memory cells for multiple read operations. In one example, the control logic may be configured to open the array of memory cells for multiple read operations by ramping up each access line of the plurality of access lines from a reference voltage to a voltage sufficient to activate each respective memory cell coupled to each access line of the plurality of access lines and ramping up each select line of the plurality of select lines from the reference voltage to a voltage sufficient to activate each respective select gate coupled to each select line of the plurality of select lines.

At 604, the control logic may be configured to bias a first select line (e.g., 215) of the plurality of select lines to connect via respective select gates (e.g., 212) of the plurality of select gates each data line (e.g., 204) of the plurality of data lines to a respective first string of series-connected memory cells (e.g., 206) of the plurality of strings of series-connected memory cells. At 606, the control logic may be configured to read first page data from respective memory cells (e.g., 208) coupled to a first selected access line (e.g., 202) of the plurality of access lines for the respective first strings of series-connected memory cells. At 608, the control logic may be configured to read second page data from the respective memory cells coupled to the first selected access line for the respective first strings of series-connected memory cells without closing the array of memory cells following the reading of the first page data.

Figure 11B:
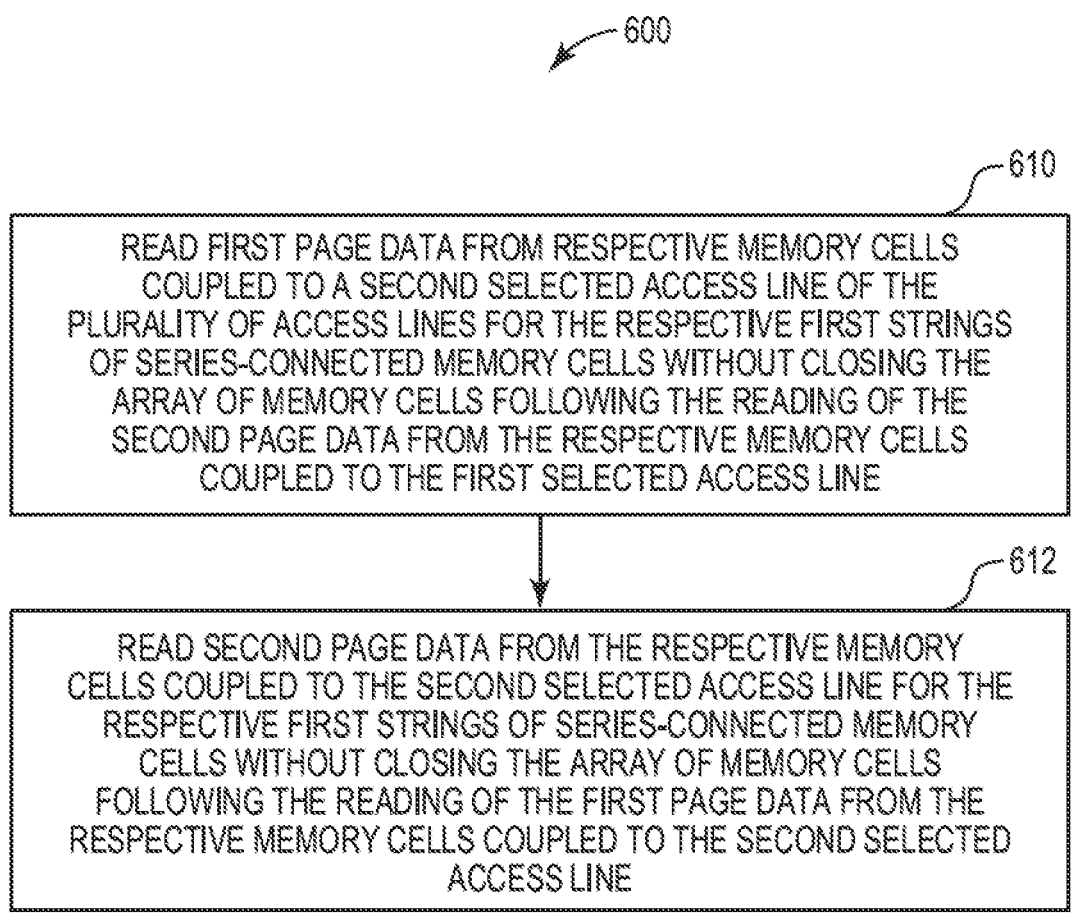

As illustrated in FIG. 11B at 610, the control logic may be further configured to read first page data from respective memory cells coupled to a second selected access line of the plurality of access lines for the respective first strings of series-connected memory cells without closing the array of memory cells following the reading of the second page data from the respective memory cells coupled to the first selected access line. At 612, the control logic may be further configured to read second page data from the respective memory cells coupled to the second selected access line for the respective first strings of series-connected memory cells without closing the array of memory cells following the reading of the first page data from the respective memory cells coupled to the second selected access line.

Figure 11C:
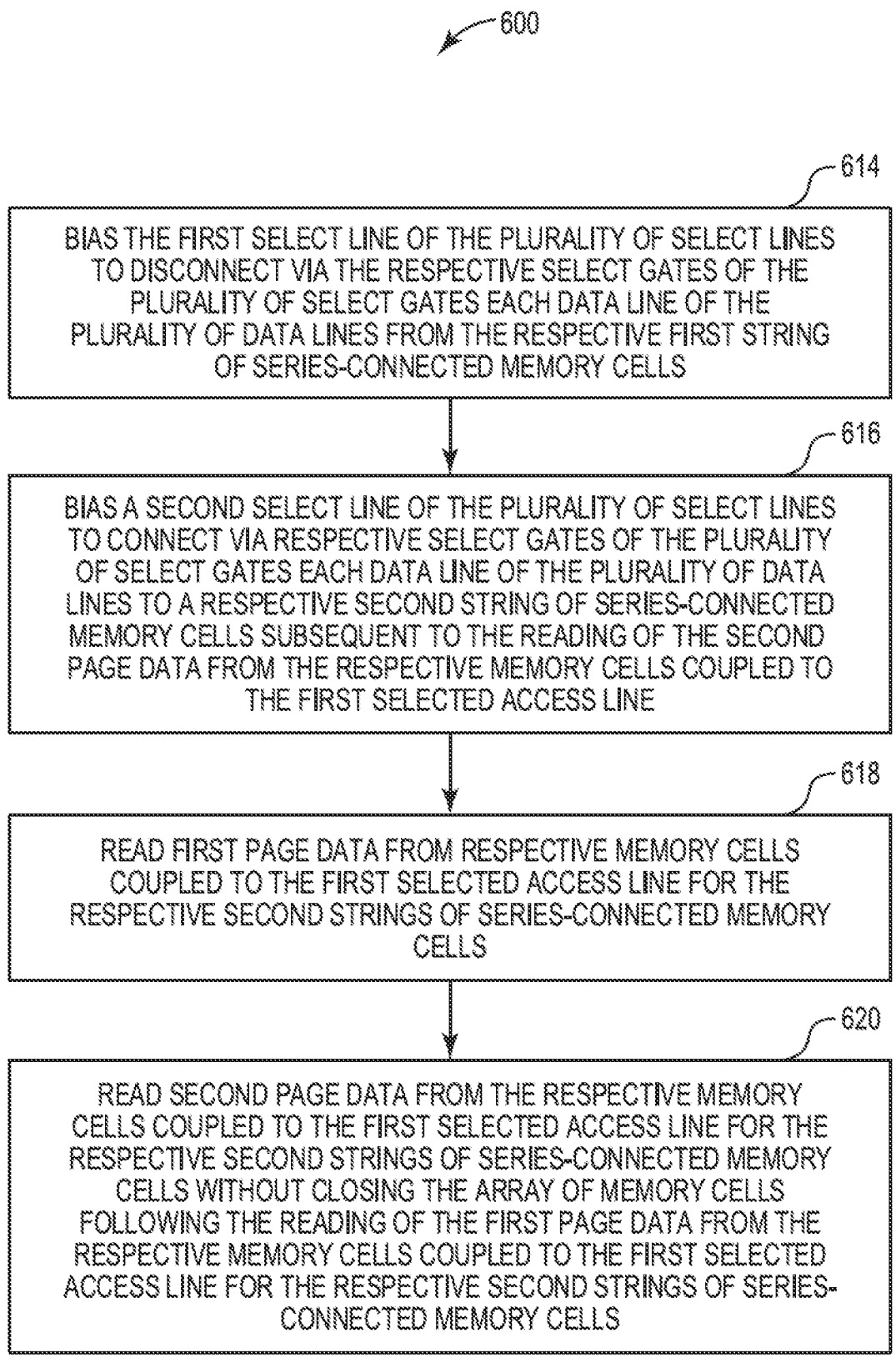

As illustrated in FIG. 11C at 614, the control logic may be further configured to bias the first select line of the plurality of select lines to disconnect via the respective select gates of the plurality of select gates each data line of the plurality of data lines from the respective first string of series-connected memory cells. At 616, the control logic may be further configured to bias a second select line of the plurality of select lines to connect via respective select gates of the plurality of select gates each data line of the plurality of data lines to a respective second string of series-connected memory cells subsequent to the reading of the second page data from the respective memory cells coupled to the first selected access line. At 618, the control logic may be further configure to read first page data from respective memory cells coupled to the first selected access line for the respective second strings of series-connected memory cells. At 620, the control logic may be further configured to read second page data from the respective memory cells coupled to the first selected access line for the respective second strings of series-connected memory cells without closing the array of memory cells following the reading of the first page data from the respective memory cells coupled to the first selected access line for the respective second strings of series-connected memory cells.

Figure 11D:
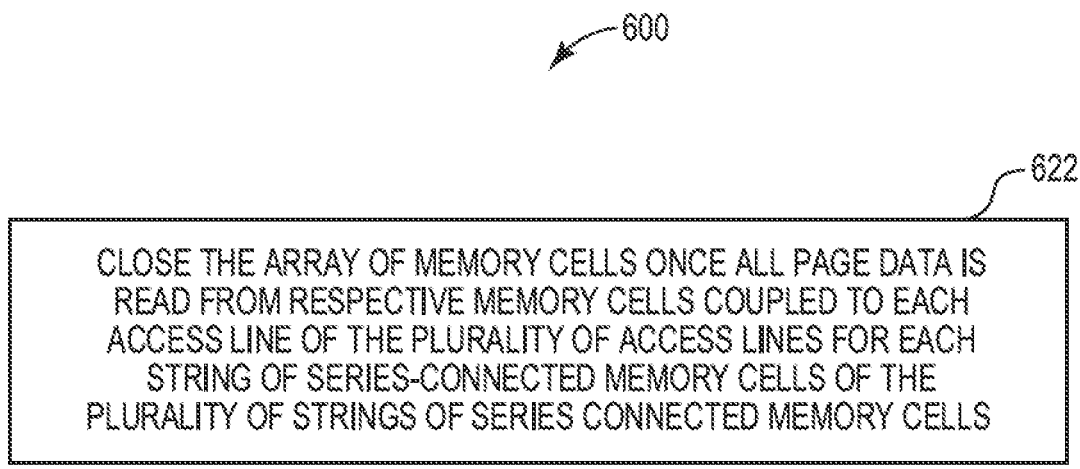

As illustrated in FIG. 11D at 622, the control logic may be further configured to close the array of memory cells once all page data is read from respective memory cells coupled to each access line of the plurality of access lines for each string of series-connected memory cells of the plurality of strings of series-connected memory cells. In one example, the control logic may be configured to close the array of memory cells by ramping up each access line of the plurality of access lines to a voltage sufficient to activate each respective memory cell coupled to each access line of the plurality of access lines followed by ramping down each access line of the plurality of access lines to a reference voltage and ramping up each select line of the plurality of select lines to a voltage sufficient to activate each respective select gate coupled to each select line of the plurality of select lines followed by ramping down each select line of the plurality of select lines down to the reference voltage.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
an array of memory cells comprising a plurality of strings of series-connected memory cells;
a plurality of access lines, each access line of the plurality of access lines connected to a control gate of a respective memory cell of each string of series-connected memory cells of the plurality of strings of series-connected memory cells;
a voltage generation device to selectively apply voltages to the plurality of access lines; and
control logic configured to:
open the array of memory cells for multiple read operations;
read first page data from respective memory cells coupled to a selected access line of the plurality of access lines for a first block of memory cells of the array of memory cells;
read second page data from the respective memory cells coupled to the selected access line for a second block of memory cells of the array of memory cells; and
close the array of memory cells subsequent to reading the first page data and the second page data,
wherein the first page data comprises a first logical page and the second page data comprises a second logical page.

2. The memory device of claim 1, further comprising:
a plurality of data lines, each data line of the plurality of data lines connected to a respective string of series-connected memory cells of the plurality of strings of series-connected memory cells; and
a page buffer connected to the plurality of data lines, the page buffer comprising a respective plurality of latches for each data line of the plurality of data lines to store the first page data and the second page data in parallel.

3. The memory device of claim 1, further comprising:
a plurality of data lines, each data line of the plurality of data lines connected to a respective string of series-connected memory cells of the plurality of strings of series-connected memory cells; and
a page buffer connected to the plurality of data lines, the page buffer comprising a respective latch for each data line of the plurality of data lines to sequentially store the first page data and the second page data,
wherein the control logic is configured to transfer the first page data out of the respective latch for each data line of the plurality of data lines prior to reading the second page data.

4. The memory device of claim 1, further comprising:
a plurality of data lines, each data line of the plurality of data lines connected to a respective string of series-connected memory cells of the plurality of strings of series-connected memory cells; and
a page buffer connected to the plurality of data lines, the page buffer comprising a respective latch for each data line of the plurality of data lines to sequentially store the first page data and the second page data,
wherein the control logic is configured to transfer the first page data out of the respective latch for each data line of the plurality of data lines concurrently with reading the second page data.

5. The memory device of claim 1, wherein the control logic is configured to:
open the array of memory cells for multiple read operations by ramping up each access line of the plurality of access lines from a reference voltage to a voltage sufficient to activate each respective memory cell coupled to each access line of the plurality of access lines; and
close the array of memory cells by ramping up each access line of the plurality of access lines to the voltage sufficient to activate each respective memory cell coupled to each access line of the plurality of access lines followed by ramping down each access line of the plurality of access lines to the reference voltage.

6. The memory device of claim 5, wherein the control logic is configured to read the second page data without ramping down an unselected access line of the plurality of access lines to the reference voltage after reading the first page data.

7. The memory device of claim 5, wherein the control logic is configured to read the second page data without ramping down any unselected access lines of the plurality of access lines to the reference voltage after reading the first page data.

8. A memory device comprising:
an array of memory cells comprising a plurality of strings of series-connected memory cells;
a plurality of access lines, each access line of the plurality of access lines connected to a control gate of a respective memory cell of each string of series-connected memory cells of the plurality of strings of series-connected memory cells;
a voltage generation device to selectively apply voltages to the plurality of access lines; and
control logic configured to:
open the array of memory cells for multiple read operations;
read first page data from respective memory cells coupled to a selected access line of the plurality of access lines for a first block of memory cells of the array of memory cells;

read second page data from the respective memory cells coupled to the selected access line for a second block of memory cells of the array of memory cells;

read third page data from the respective memory cells coupled to the selected access line for a third block of memory cells of the array of memory cells; and close the array of memory cells subsequent to reading the first page data, the second page data, and the third page data.

9. The memory device of claim 8, further comprising:

a plurality of data lines, each data line of the plurality of data lines connected to a respective string of series-connected memory cells of the plurality of strings of series-connected memory cells; and a page buffer connected to the plurality of data lines, the page buffer comprising a respective plurality of latches for each data line of the plurality of data lines to store the first page data, the second page data, and the third page data in parallel.

10. The memory device of claim 8, further comprising:

a plurality of data lines, each data line of the plurality of data lines connected to a respective string of series-connected memory cells of the plurality of strings of series-connected memory cells; and a page buffer connected to the plurality of data lines, the page buffer comprising a respective latch for each data line of the plurality of data lines to sequentially store the first page data, the second page data, and the third page data, wherein the control logic is configured to transfer the first page data out of the respective latch for each data line of the plurality of data lines prior to reading the second page data.

11. The memory device of claim 8, wherein the first page data comprises a first logical page, the second page data comprises a second logical page, and the third page data comprises a third logical page.

12. The memory device of claim 8, wherein the control logic is configured to:

open the array of memory cells for multiple read operations by ramping up each access line of the plurality of access lines from a reference voltage to a voltage sufficient to activate each respective memory cell coupled to each access line of the plurality of access lines; and close the array of memory cells by ramping up each access line of the plurality of access lines to the voltage sufficient to activate each respective memory cell coupled to each access line of the plurality of access lines followed by ramping down each access line of the plurality of access lines to the reference voltage.

13. The memory device of claim 12, wherein the control logic is configured to read the second page data without ramping down an unselected access line of the plurality of access lines to the reference voltage after reading the first page data.

14. The memory device of claim 13, wherein the control logic is configured to read the second page data without ramping down an unselected access line of the plurality of access lines to the reference voltage after reading the second page data.

15. The memory device of claim 12, wherein the control logic is configured to read the second page data without ramping down any unselected access lines of the plurality of access lines to the reference voltage after reading the first page data.

16. The memory device of claim 15, wherein the control logic is configured to read the second page data without ramping down any unselected access lines of the plurality of access lines to the reference voltage after reading the second page data.

* * * * *